United States Patent
Matsumoto

(10) Patent No.: US 9,589,736 B2
(45) Date of Patent: Mar. 7, 2017

(54) DYE-SENSITIZED SOLAR CELL ELEMENT

(71) Applicant: FUJIKURA LTD., Koto-ku, Toyko (JP)

(72) Inventor: Daisuke Matsumoto, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/781,209

(22) PCT Filed: Dec. 18, 2013

(86) PCT No.: PCT/JP2013/083824
§ 371 (c)(1),
(2) Date: Sep. 29, 2015

(87) PCT Pub. No.: WO2014/162639
PCT Pub. Date: Oct. 9, 2014

(65) Prior Publication Data
US 2016/0055982 A1    Feb. 25, 2016

(30) Foreign Application Priority Data
Mar. 30, 2013  (JP) ................................. 2013-075455

(51) Int. Cl.
*H01L 31/044* (2014.01)
*H01G 9/20* (2006.01)
*H01L 31/054* (2014.01)

(52) U.S. Cl.
CPC ........... *H01G 9/209* (2013.01); *H01G 9/2031* (2013.01); *H01G 9/2059* (2013.01);
(Continued)

(58) Field of Classification Search
CPC ........ H01L 31/00–31/078; Y02E 10/50–10/60
(Continued)

(56) References Cited

U.S. PATENT DOCUMENTS

2008/0308155 A1* 12/2008 Fukui .................. H01G 9/2031
                                                      136/261
2010/0163102 A1   7/2010 Ho et al.
2012/0312370 A1* 12/2012 Demopoulos ............ H01B 1/22
                                                      136/256

FOREIGN PATENT DOCUMENTS

EP          1 788 658 A1    5/2007
JP        2002-289274 A    10/2002
(Continued)

OTHER PUBLICATIONS

International Search Report for PCT/JP2013/083824 dated Jan. 21, 2014 [PCT/ISA/210].
(Continued)

*Primary Examiner* — Bach Dinh
(74) *Attorney, Agent, or Firm* — Sughrue Mion, PLLC

(57) ABSTRACT

A dye-sensitized solar cell (DSC) element includes at least one DSC, and the DSC includes a first electrode, a second electrode facing the first electrode, and an oxide semiconductor layer provided on the first electrode. The oxide semiconductor layer includes a light absorbing layer provided on the first electrode and a reflecting layer as a layer contacting a portion of a first surface of a side opposite to the first electrode among surfaces of the light absorbing layer and being arranged at a position farthest from the first electrode. The first surface of the light absorbing layer includes a second surface contacting the reflecting layer, and a surface area $S_1$ of the first surface and a surface area $S_2$ of the second surface satisfy the following formula:

$0.7 \leq S_2/S_1 < 1$

The reflecting layer is arranged in an inner side of the first surface of the light absorbing layer.

4 Claims, 15 Drawing Sheets

(52) U.S. Cl.
CPC ......... *H01L 31/054* (2014.12); *H01G 9/2081* (2013.01); *Y02E 10/542* (2013.01)

(58) Field of Classification Search
USPC ................................................ 136/243–265
See application file for complete search history.

(56) References Cited

FOREIGN PATENT DOCUMENTS

| | | |
|---|---|---|
| JP | 2003-142171 A | 5/2003 |
| JP | 2004-311197 A | 11/2004 |
| JP | 4063802 B2 | 3/2008 |
| JP | 2008-258011 A | 10/2008 |
| JP | 2009-037779 A | 2/2009 |
| JP | 2009-129552 A | 6/2009 |
| JP | 2012-119189 A | 6/2012 |

OTHER PUBLICATIONS

Written Opinion for PCT/JP2013/083824 dated Jan. 21, 2014 [PCT/ISA/237].
Meysam Pazoki et al., "CVD-grown TiO2 particles as light scattering structures in dye-sensitized solar cells", RSC Advances, 2012, vol. 2, No. 32, pp. 12278-12285, XP055310634.
Min-Kyu Son et al., "Analysis on the Light-Scattering Effect in Dye-Sensitized Solar Cell according to the TiO2 Structural Differences", International Journal of Photoenergy, 2012, vol. 2012, ID 480929, XP055310637, total 9 pages.
Communication dated Oct. 21, 2016 from the European Patent Office in counterpart Application No. 13881218.5.

\* cited by examiner

DYE-SENSITIZED SOLAR CELL ELEMENT

CROSS REFERENCE TO RELATED APPLICATIONS

This Application is a National Stage of International Application No. PCT/JP2013/083824 filed Dec. 18, 2013, claiming priority based on Japanese Patent Application No. 2013-075455 filed Mar. 30, 2013, the contents of all of which are incorporated herein by reference in their entirety.

TECHNICAL FIELD

The present invention relates to a dye-sensitized solar cell element.

BACKGROUND ART

Since dye-sensitized solar cell elements as photoelectric conversion elements can obtain high photoelectric conversion efficiency with a low cost, the dye-sensitized solar cell elements have drawn much attention, and thus, various developments of the dye-sensitized solar cell elements have been made.

The dye-sensitized solar cell element includes at least one dye-sensitized solar cell, and the dye-sensitized solar cell typically includes a working electrode and a counter electrode. The working electrode includes a transparent substrate, a conductive substrate having a transparent conductive film formed thereon, and an oxide semiconductor layer provided on the conductive substrate.

With respect to such a dye-sensitized solar cell element, improvement of the photoelectric conversion characteristics is further required. For this reason, various studies have been made, for example, while paying attention to the working electrode of the dye-sensitized solar cell.

For example, Patent Document 1 discloses a photoelectrode including a conductive substrate and a semiconductor layer to which a photosensitizing dye is adsorbed, where the semiconductor layer includes a proximal layer provided on the conductive substrate and a distal layer provided to cover at least a part of a surface of a side opposite to the conductive substrate and a side surface among surfaces of the proximal layer.

CITATION LIST

Patent Document

Patent Document 1: JP 4063802 B1 (FIG. 1)

SUMMARY OF THE INVENTION

Problem to be Solved by the Invention

However, a dye-sensitized solar cell module including the photoelectrode disclosed in the above-described Patent Document 1 had a room for improvement in terms of photoelectric conversion characteristics.

The present invention has been made taking into consideration the above-described situations, and an object of the invention is to provide a dye-sensitized solar cell element capable of sufficiently improving the photoelectric conversion characteristics.

Means for Solving Problem

In order to solve the above-described problems, the inventor made intensive studies while paying attention on a configuration of the oxide semiconductor layer. As a result, it was found out that the above-described problems can be solved by the following invention.

Namely, the present invention is a dye-sensitized solar cell element including at least one dye-sensitized solar cell, wherein the dye-sensitized solar cell includes a first electrode, a second electrode which faces the first electrode, and an oxide semiconductor layer which is provided on the first electrode, wherein the oxide semiconductor layer includes a light absorbing layer which is provided on the first electrode and a reflecting layer as a layer which is in contact with a portion of a first surface of a side opposite to the first electrode among surfaces of the light absorbing layer and which is arranged at a position farthest from the first electrode, wherein the first surface of the light absorbing layer includes a second surface which is in contact with the reflecting layer, wherein a surface area $S_1$ of the first surface and a surface area $S_2$ of the second surface satisfy the following formula:

$$0.7 \leq S_2/S_1 < 1$$

and wherein the reflecting layer is arranged in an inner side of the first surface of the light absorbing layer.

According to the dye-sensitized solar cell element of the invention, the oxide semiconductor layer includes a light absorbing layer and a reflecting layer which is in contact with a portion of a first surface of the light absorbing layer, and the reflecting layer is arranged in an inner side of the first surface of the light absorbing layer. In addition, a surface area $S_1$ of the first surface and a surface area $S_2$ of the second surface satisfy the following formula.

$$0.7 \leq S_2/S_1 < 1$$

Namely, the surface area $S_2$ of the second surface which is in contact with the reflecting layer among the surfaces of the light absorbing layer is smaller than the surface area $S_1$ of the first surface of the light absorbing layer. Namely, an occupation ratio of the reflecting layer which easily becomes a site of a leakage current to the first surface of the light absorbing layer is reduced. For this reason, an open-circuit voltage can be increased. On the other hand, since $S_2/S_1$ is 0.7 or more, light passing through the light absorbing layer and incident therefrom can be sufficiently reflected, so that light absorbing efficiency of the light absorbing layer may be improved. In this manner, according to the invention, $S_2/S_1$ satisfies the above-described formula, so that the open-circuit voltage can be increased and the light absorbing efficiency can also be improved. In addition, the reflecting layer is arranged in the inner side of the first surface of the light absorbing layer, so that the reflecting layer does not cover a side surface of the light absorbing layer. For this reason, since an electrolyte is infiltrated from the side surface of the light absorbing layer, a surface area where the electrolyte and the light absorbing layer are in contact with each other is increased. A distance until an oxidation-reduction pairs in the electrolyte reach the light absorbing layer is shortened, so that internal resistance is reduced. Therefore, according to the dye-sensitized solar cell element of the invention, the photoelectric conversion characteristics can be sufficiently improved.

In the above dye-sensitized solar cell element, preferably, the surface area $S_1$ of the first surface and the surface area $S_2$ of the second surface satisfy the following formula.

$$0.8 \leq S_2/S_1 < 0.95$$

In this case, the photoelectric conversion characteristics of the dye-sensitized solar cell element can be further improved.

In the above dye-sensitized solar cell element, preferably, a non-contact portion of the first surface which is not in contact with the reflecting layer is not arranged in an inner side of the second surface.

In this case, in comparison with a case where the non-contact portion is arranged in the inner side of the second surface, the occurrence of voltage irregularities can be more sufficiently suppressed. For this reason, the light absorbing efficiency becomes constant in the inner portion of the light absorbing layer, so that the leakage current can be more sufficiently suppressed. As a result, the photoelectric conversion characteristics can be more sufficiently improved.

Herein, preferably, the second surface is surrounded by the non-contact portion.

In this case, in the entire periphery of the second surface, the electrolyte can be infiltrated from the non-contact portion. Therefore, oxidation-reduction pairs in the electrolyte are more easily infiltrated into the light absorbing layer, so that internal resistance can be further reduced.

In the above dye-sensitized solar cell element, preferably, the oxide semiconductor layer contains an anatase crystalline titanium oxide made of an anatase crystal and a rutile crystalline titanium oxide made of a rutile crystal, the reflecting layer contains the rutile crystalline titanium oxide, the light absorbing layer contains the anatase crystalline titanium oxide and the rutile crystalline titanium oxide, and a content of the rutile crystalline titanium oxide in the reflecting layer is larger than a content of the rutile crystalline titanium oxide in the light absorbing layer.

In this case, for example, sunlight passes through the first electrode and is incident on the oxide semiconductor layer. Next, the light passes through the light absorbing layer of the oxide semiconductor layer and is incident on the reflecting layer. At this time, a refractive index of the rutile crystalline titanium oxide is higher than that of the anatase crystalline titanium oxide, and thus, the rutile crystalline titanium oxide more easily scatters the light than the anatase crystalline titanium oxide. In addition, the content of the rutile crystalline titanium oxide in the reflecting layer is larger than the content of the rutile crystalline titanium oxide in the light absorbing layer. Namely, the reflecting layer contains a larger amount of the rutile crystalline titanium oxide which easily scatters the light than the light absorbing layer. For this reason, the light which passes through the light absorbing layer and is incident on the reflecting layer can be sufficiently returned to the light absorbing layer. As a result, the light confinement effect of the oxide semiconductor layer becomes sufficient. In addition, the photosensitizing dye is more easily adsorbed to the anatase crystalline titanium oxide than to the rutile crystalline titanium oxide. For this reason, the light absorbing layer can more sufficiently absorb the light by using the photosensitizing dye adsorbed to the anatase crystalline titanium oxide than the reflecting layer. In addition, since the light absorbing layer contains the rutile crystalline titanium oxide, the light incident on the light absorbing layer is more sufficiently scattered in the inner portion of the light absorbing layer in comparison with a case where the light absorbing layer does not contain the rutile crystalline titanium oxide. Since the scattered light is efficiently absorbed by the photosensitizing dye carried in the anatase crystalline titanium oxide, light absorption efficiency is increased. As described heretofore, according to the dye-sensitized solar cell element of the invention, the photoelectric conversion characteristics can be further improved.

In the above dye-sensitized solar cell element, preferably, a content of the rutile crystalline titanium oxide in the light absorbing layer is in the range of 3 to 15 mass %.

In this case, in comparison with a case where the content of the rutile crystalline titanium oxide in the light absorbing layer is deviated from the aforementioned range, the light absorption and the light confinement are performed with a good balance, so that the photoelectric conversion characteristics of the dye-sensitized solar cell element can be further improved.

In addition, in the invention, even in a case where the surface of the side opposite to the first electrode among the surfaces of the light absorbing layer is a flat surface or even in a case where some portion of the surface of the side opposite to the first electrode among the surfaces of the light absorbing layer is formed to be protruded with respect to the remaining portion and there is a step difference between some portion and the remaining portion, the "first surface" is a flat surface as the reflecting layer is removed and the light absorbing layer is seen from the second electrode side.

In addition, in the oxide semiconductor layer in the invention, all the layers other than the reflecting layer are light absorbing layers.

Effect of the Invention

According to the invention, a dye-sensitized solar cell element capable of sufficiently improving photoelectric conversion characteristics is provided.

MODE(S) FOR CARRYING OUT THE INVENTION

Figure 1:
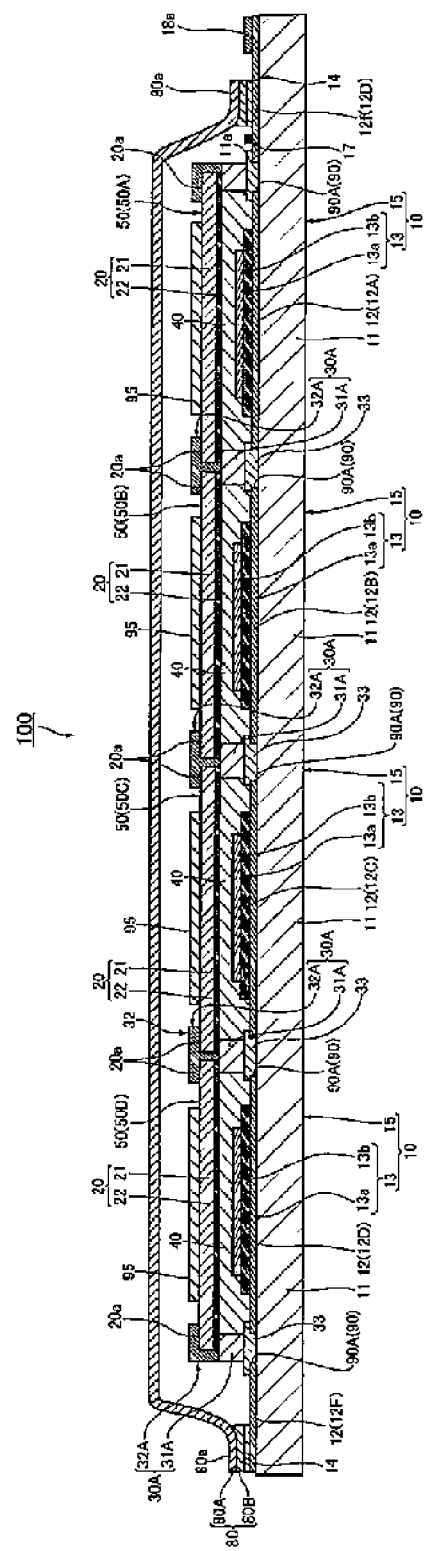
FIG. 1 is a cross-sectional view illustrating a first embodiment of a dye-sensitized solar cell element of the invention.
Figure 2:
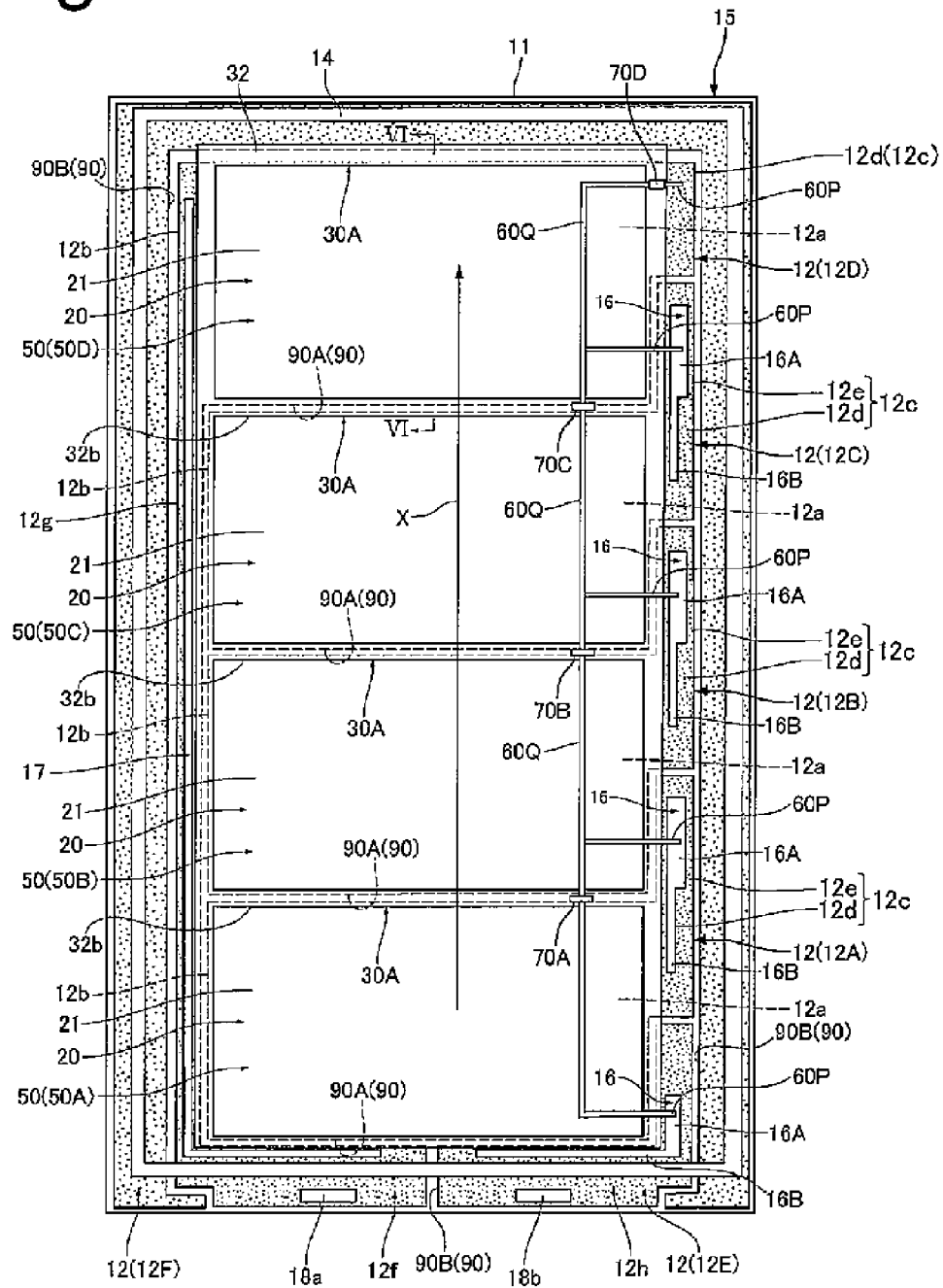
FIG. 2 is a plan view illustrating a portion of the first embodiment of the dye-sensitized solar cell element of the invention.
Figure 3:
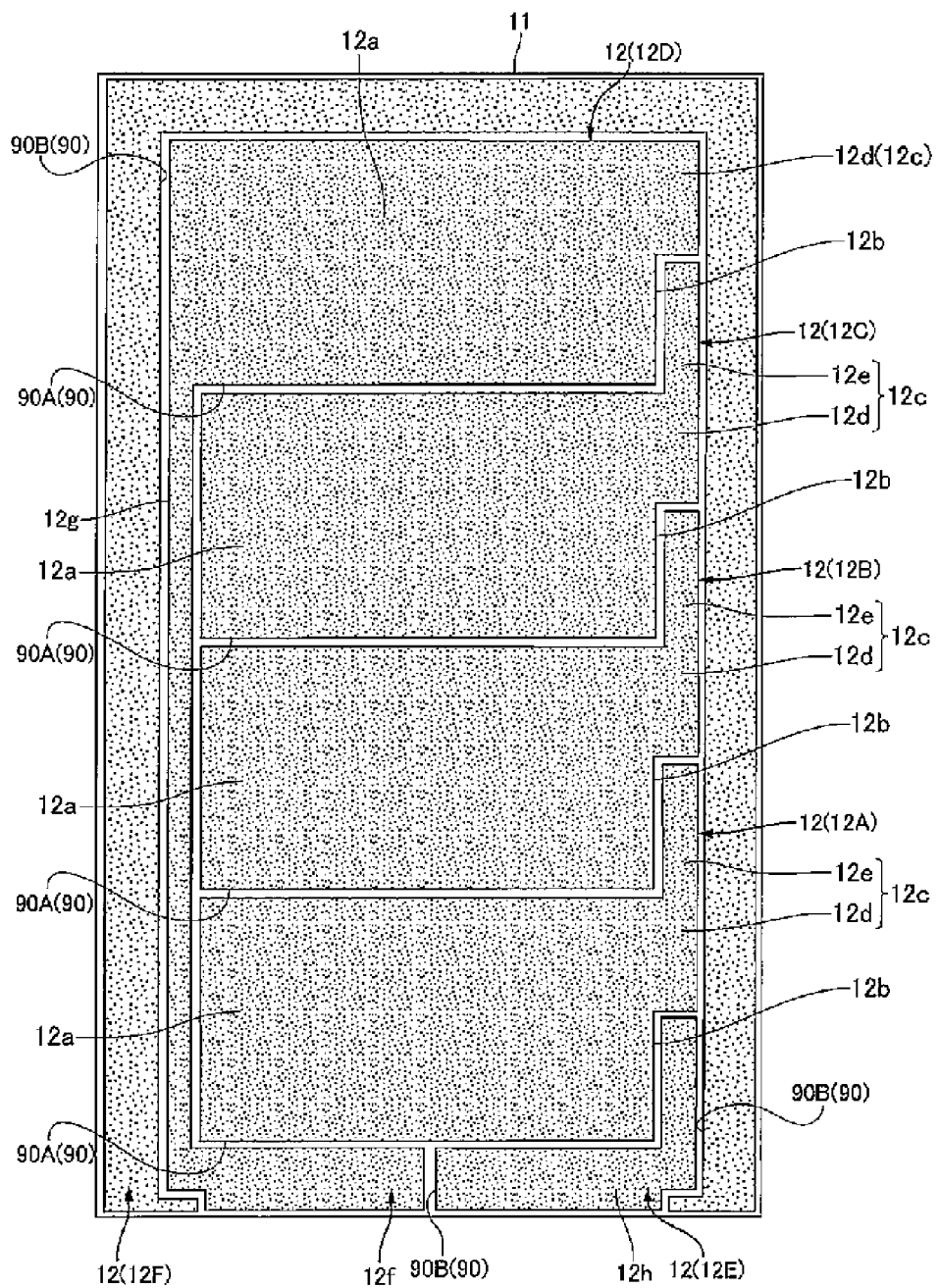
FIG. 3 is a plan view illustrating a pattern of a transparent conductive film in the dye-sensitized solar cell element of FIG. 1.
Figure 4:
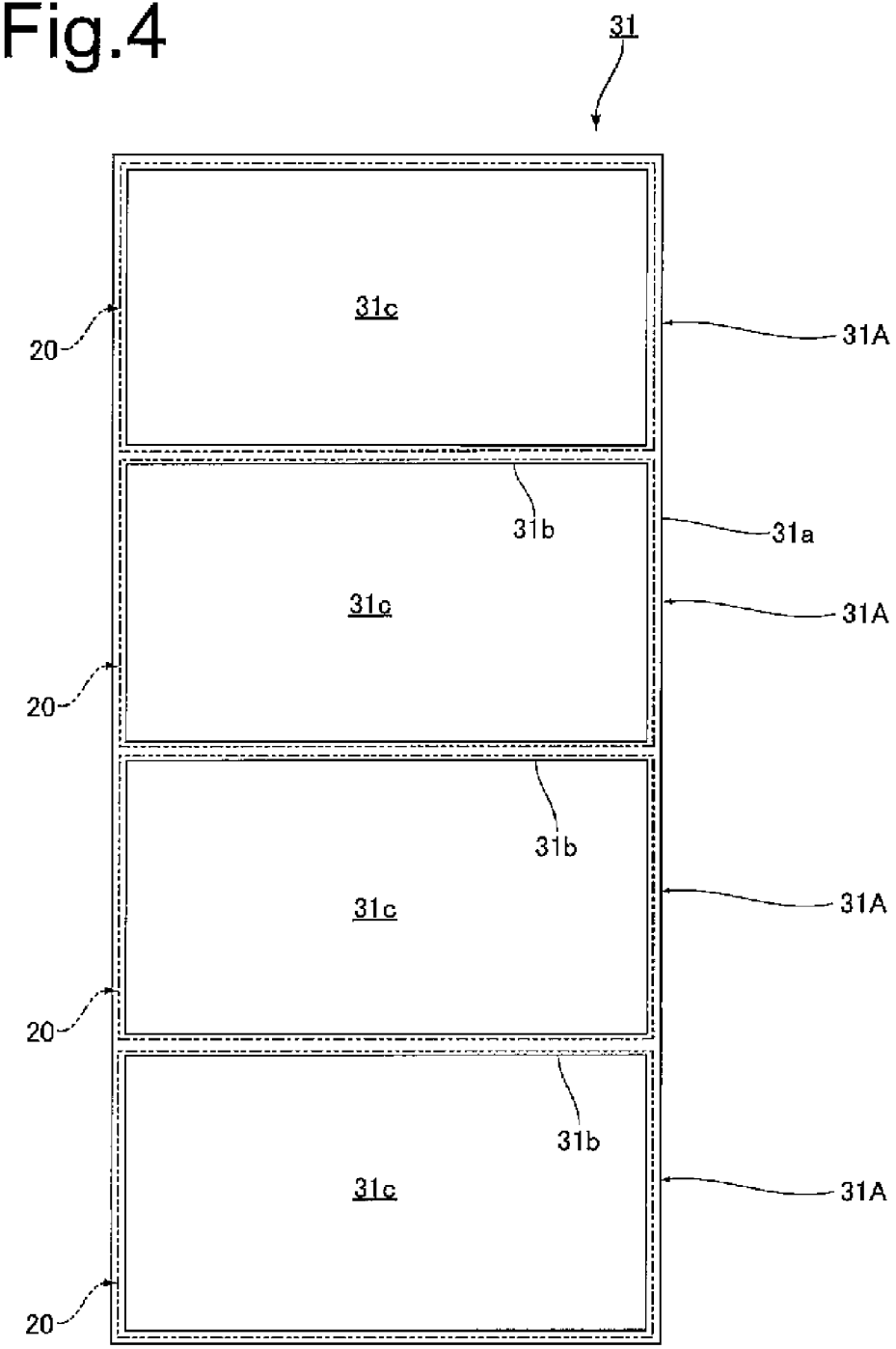
FIG. 4 is a plan view illustrating a first integrated sealing portion of FIG. 1.
Figure 5:
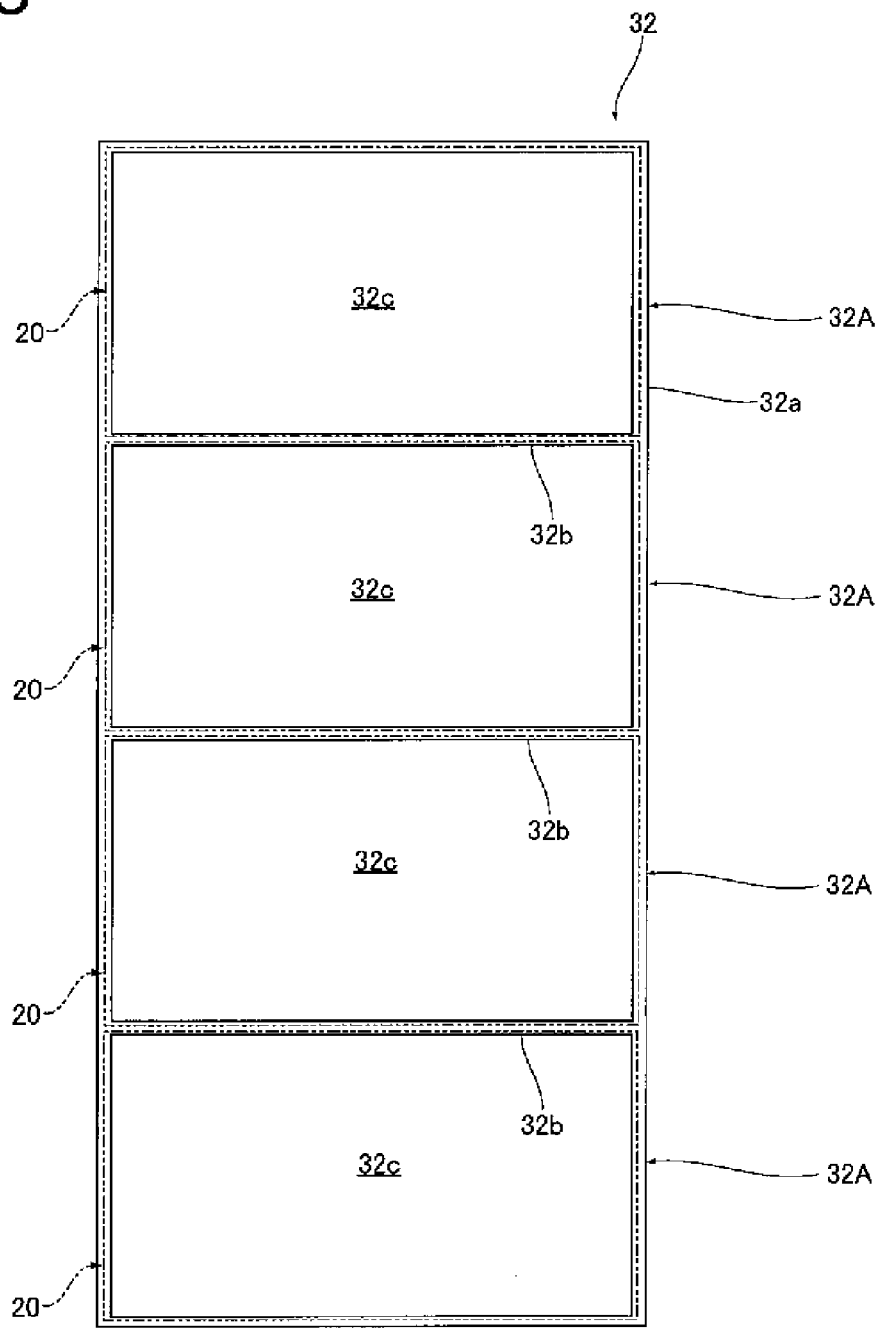
FIG. 5 is a plan view illustrating a second integrated sealing portion of FIG. 1.
Figure 6:
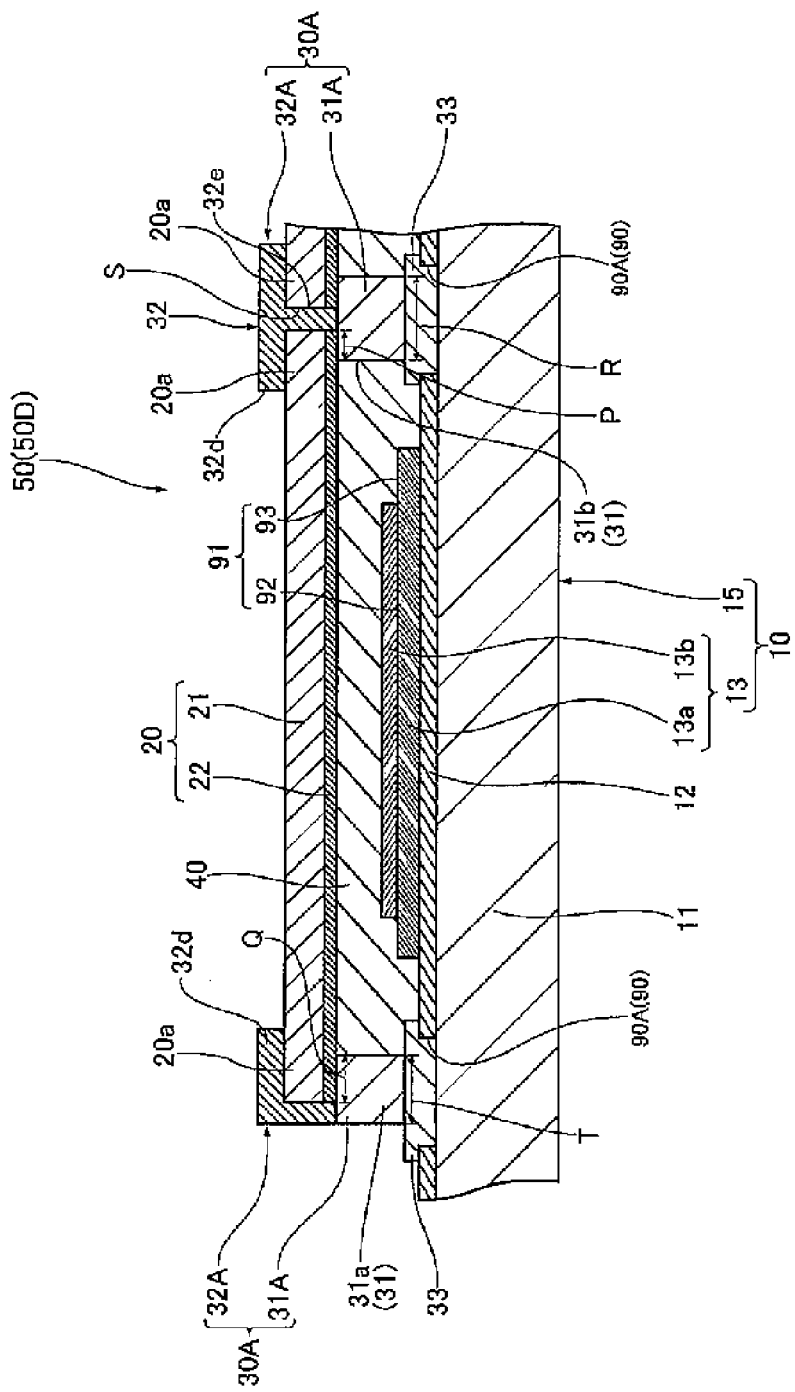
FIG. 6 is a cross-sectional view taken along line VI-VI of FIG. 2.
Figure 7:
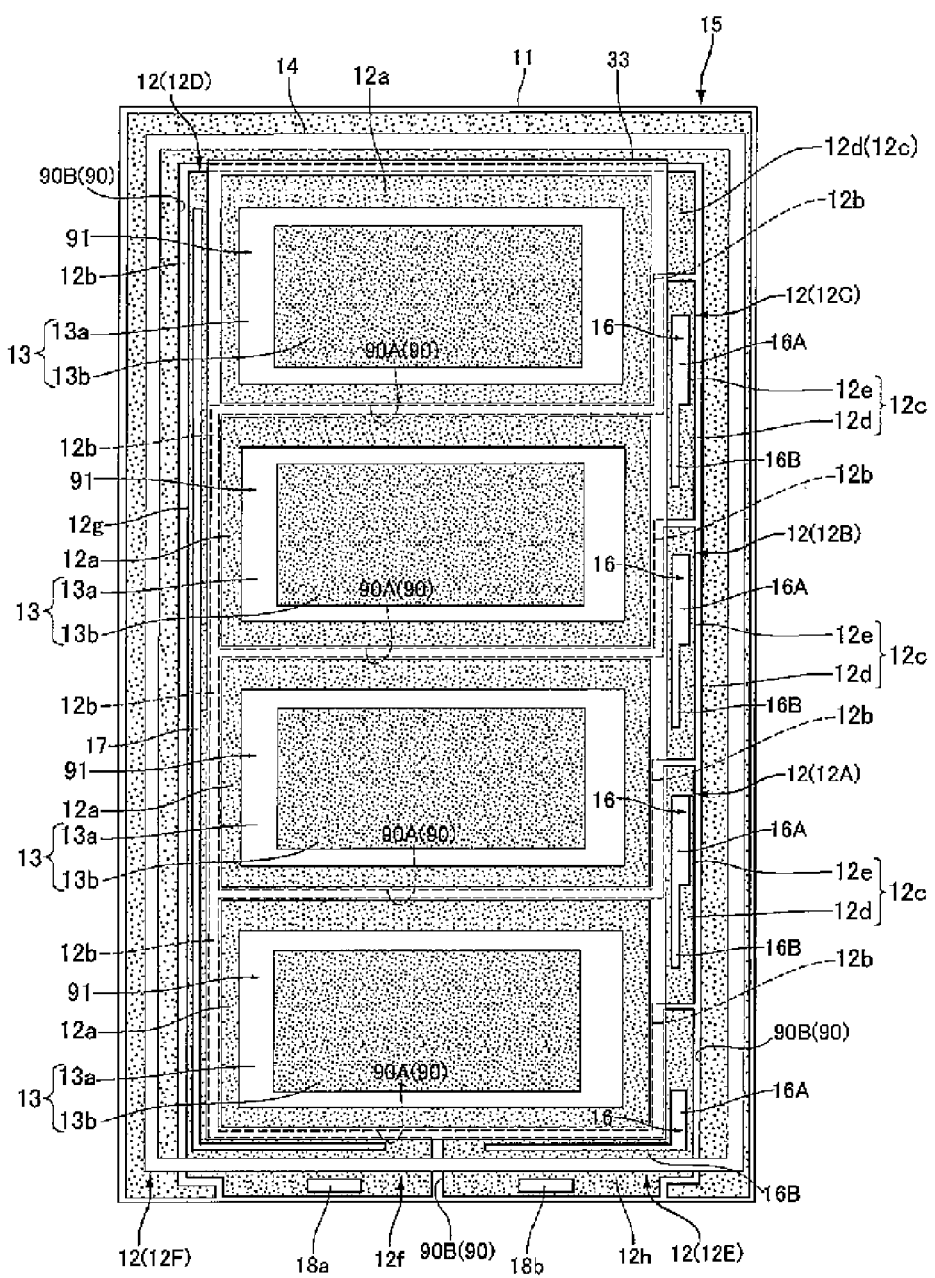
FIG. 7 is a plan view illustrating a working electrode on which a coupling portion for fixing a back sheet is formed.
Figure 8:
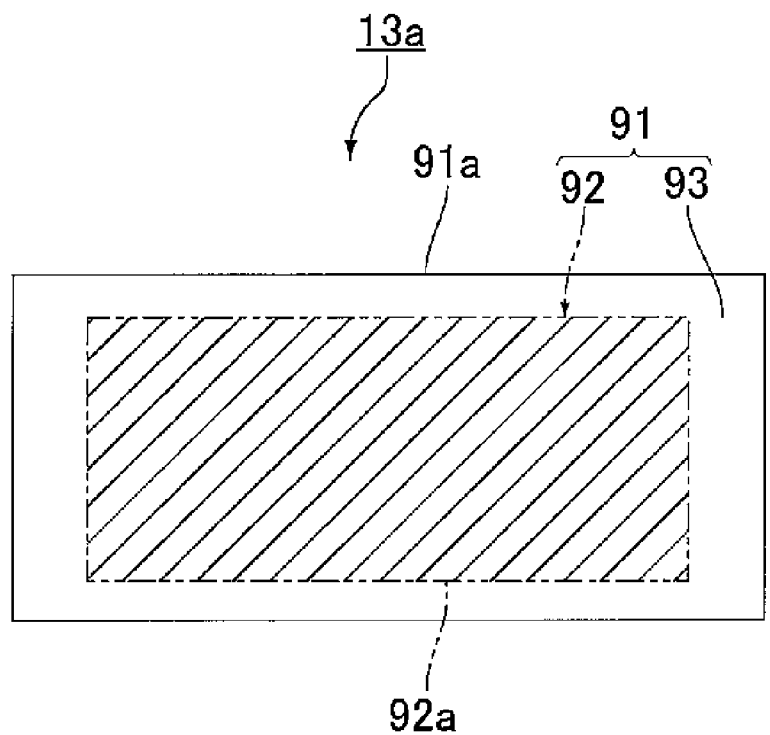
FIG. 8 is a plan view illustrating a first surface and a second surface of a light absorbing layer of FIG. 7.

Hereinafter, preferred embodiments of the dye-sensitized solar cell element of the invention will be described in detail with reference to FIG. 1 to FIG. 8. FIG. 1 is a cross-sectional view illustrating a preferred embodiment of a dye-sensitized solar cell element of the invention, FIG. 2 is a plan view illustrating a part of a preferred embodiment of a dye-sensitized solar cell element of the invention, FIG. 3 is a plan view illustrating a pattern of a transparent conductive layer of a dye-sensitized solar cell element of FIG. 1, FIG. 4 is a plan view illustrating a first integrated sealing portion of FIG. 1, FIG. 5 is a plan view illustrating a second integrated sealing portion of FIG. 1, FIG. 6 is a cross-sectional view taken along the line VI-VI in FIG. 2, FIG. 7 is a plan view illustrating a working electrode on which a coupling portion for fixing a back sheet is formed and FIG. 8 is a plan view illustrating a first surface of a light absorbing layer of FIG. 7.

As illustrated in FIG. 1, a dye-sensitized solar cell module (hereinafter, referred to as the "DSC Module" in some cases) 100 as a dye-sensitized solar cell element has a plurality (four in FIG. 1) of dye-sensitized solar cells (hereinafter, referred to as the "DSC" in some cases) 50 having a transparent substrate 11 and a back sheet 80 which is provided so as to cover the DSC 50 on the side of one surface 11a of the transparent substrate 11. As illustrated in FIG. 2, the plurality of DSCs 50 are connected in series by a conductive material 60P. Hereinafter, for convenience of description, the four DSCs 50 of the DSC module 100 are referred to as DSCs 50A to 50D in some cases.

As illustrated in FIG. 1, each of the plurality of DSCs 50 is equipped with a working electrode 10 having the conductive substrate 15, a counter electrode 20 facing the conductive substrate 15, and an annular sealing portion 30A bonding the working electrode 10 and the counter electrode 20. An electrolyte 40 is filled in the cell space formed by the conductive substrate 15, the counter electrode 20, and the annular sealing portion 30A.

The counter electrode 20 is equipped with a metal substrate 21 and a catalyst layer 22 which is provided at the working electrode 10 side of the metal substrate 21 and promotes the catalytic reaction. In addition, in two adjacent DSCs 50, the counter electrodes 20 are spaced apart from each other. In the present embodiment, the second electrode is constituted by the counter electrode 20.

As illustrated in FIGS. 1 and 2, the working electrode 10 has the conductive substrate 15 and at least one oxide semiconductor layer 13 provided on the conductive substrate 15. The conductive substrate 15 has a transparent substrate 11, a transparent conductive film 12 provided on the transparent substrate 11, an insulating material 33 provided on the transparent substrate 11, and a connecting terminal 16 provided on the transparent conductive film 12. The oxide semiconductor layer 13 is arranged in an inner side of the annular sealing portion 30A. In addition, a photosensitizing dye is adsorbed to the oxide semiconductor layer 13.

The transparent substrate 11 is used as the common transparent substrate of the DSCs 50A to 50D. Meanwhile, in the present embodiment, a first electrode is constituted by the conductive substrate 15.

As illustrated in FIGS. 6 and 7, the oxide semiconductor layer 13 has a light absorbing layer 13a provided on the conductive substrate 15 and a reflecting layer 13b as a layer which is in contact with a portion of a first surface 91 of a side opposite to the conductive substrate 15 among the surfaces of the light absorbing layer 13a and which is arranged at a position farthest from the conductive substrate 15. As illustrated in FIG. 8, the first surface 91 of the light absorbing layer 13a has a second surface 92 which is in contact with the reflecting layer 13b, and the surface area $S_1$ of the first surface 91 and the surface area $S_2$ of the second surface 92 satisfy the following formula.

$$0.7 \leq S_2/S_1 < 1$$

In addition, the reflecting layer 13b is arranged in an inner side of the first surface 91 of the light absorbing layer 13a. Herein, the inner side of the first surface 91 denotes an inner side of a peripheral edge 91a of the first surface 91.

In addition, as illustrated in FIG. 8, a non-contact portion 93 of the first surface 91 of the light absorbing layer 13a, which is not in contact with the reflecting layer 13b, is arranged in an outer side of the second surface 92 but not arranged in an inner side thereof. Herein, the inner side of the second surface 92 denotes an inner side of the peripheral edge 92a of the second surface 92. Furthermore, in the light absorbing layer 13a, the entire of the second surface 92 is surrounded by the non-contact portion 93. In other words, the second surface 92 is arranged in the inner side of the annular non-contact portion 93.

As illustrated in FIGS. 2 and 3, the transparent conductive film 12 is configured by transparent conductive films 12A to 12F which are provided in a state of being insulated from each other. Namely, the transparent conductive films 12A to 12F are arranged to interpose a groove 90. Herein, the transparent conductive films 12A to 12D constitute the transparent conductive films 12 of a plurality of DSCs 50A to 50D, respectively. In addition, the transparent conductive film 12E is arranged to be bent along the sealing portion 30A. The transparent conductive film 12F is an annular transparent electrode film 12 for fixing a peripheral edge portion 80a of a back sheet 80 and surrounds the transparent conductive films 12A to 12E (See FIG. 1).

As illustrated in FIG. 3, all of the transparent conductive layers 12A to 12D have a quadrangular-shaped main body portion 12a having a side edge portion 12b and a protruding portion 12c which laterally protrudes from the side edge portion 12b of the main body portion 12a.

As illustrated in FIG. 2, the protruding portion 12c of the transparent conductive layer 12C among the transparent conductive layers 12A to 12D has a projecting portion 12d which laterally projects with respect to the arrangement direction X of the DSCs 50A to 50D and a facing portion 12e which extends from the projecting portion 12d and faces the main body portion 12a of the adjacent DSC 50D via the groove 90.

In the DSC 50B as well, the protruding portion 12c of the transparent conductive layer 12B has the projecting portion 12d and the facing portion 12e. In addition, in the DSC 50A as well, the protruding portion 12c of the transparent conductive layer 12A has the projecting portion 12d and the facing portion 12e.

Meanwhile, the DSC 50D is connected with the DSC 50C already and there is no other DSC 50 to be connected. For this reason, in the DSC 50D, the protruding portion 12c of the transparent conductive layer 12D does not have a facing portion 12e. In other words, the protruding portion 12c of the transparent conductive layer 12D is constituted by only the projecting portion 12d.

However, the transparent conductive layer 12D further has a first current extracting portion 12f for extracting the current generated in the DSC module 100 to the outside and a connecting portion 12g which connects the first current extracting portion 12f with the main body portion 12a and extends along the side edge portion 12b of the transparent conductive layers 12A to 12C. The first current extracting portion 12f is disposed in the vicinity of the DSC 50A and on the side opposite to the transparent conductive layer 12B with respect to the transparent conductive layer 12A.

On the other hand, the transparent conductive film 12E also includes a second current extracting portion 12h for extracting the current generated by the DSC module 100 to the outside, and the second current extracting portion 12h is arranged in the vicinity of the DSC 50A and on the side opposite to the transparent conductive film 12B with respect to the transparent conductive film 12A. A first current extracting portion 12f and the second current extracting portion 12h are arranged to be adjacent to each other via the groove 90B (90) in the periphery of the DSC 50A. Herein, the groove 90 is configured by a first groove 90A which is formed along an edge portion of the main body portion 12a of the transparent conductive film 12 and a second groove 90B which is formed along an edge portion of a portion of the transparent conductive film 12 excluding the main body portion 12a and intersects the peripheral edge portion 80a of the back sheet 80.

In addition, connecting terminals 16 are provided on protrusion portions 12c of the transparent conductive films 12A to 12C and the transparent conductive film 12E. Each connecting terminal 16 includes a conductive material connecting portion 16A which is connected to a conductive material 60P and extends along the sealing portion 30A in the outer side of the sealing portion 30A and a conductive material non-connecting portion 16B which extends from the conductive material connecting portion 16A along the sealing portion 30A in the outer side of the sealing portion 30A. In the embodiment, in the transparent conductive films 12A to 12C, at least the conductive material connecting portion 16A of the connecting terminal 16 is provided on the facing portion 12e of the protrusion portion 12c and faces the main body portion 12a of the connected adjacent DSC 50. In the transparent conductive film 12E, the conductive material connecting portion 16A of the connecting terminal 16 faces the main body portion 12a of the connected adjacent DSC 50A. A width of the conductive material non-connecting portion 16B is narrower than that of the conductive material connecting portion 16A. Herein, the width of the conductive material connecting portion 16A and the width of the conductive material non-connecting portion 16B are set to be constant. In addition, the width of the conductive material connecting portion 16A denotes a length in the direction perpendicular to the extending direction of the conductive material connecting portion 16A and the narrowest width in the width of the conductive material connecting portion 16A, and the width of the conductive material non-connecting portion 16B denotes a length in the direction perpendicular to the extending direction of the conductive material non-connecting portion 16B and the narrowest width in the width of the conductive material non-connecting portion 16B.

In addition, the conductive material connecting portion 16A of the connecting terminal 16 provided on the protruding portion 12c of the transparent conductive film 12C of the DSC 50C is connected with the metal substrate 21 of the counter electrode 20 of the adjacent DSC 50D via the conductive material 60P. The conductive material 60P is disposed so as to pass over the sealing portion 30A. In the same manner, the conductive material connecting portion 16A of the connecting terminal 16 of the DSC 50B is connected with the metal substrate 21 of the counter electrode 20 of the adjacent DSC 50C via the conductive material 60P, the conductive material connecting portion 16A of the connecting terminal 16 of the DSC 50A is connected with the metal substrate 21 of the counter electrode 20 of the adjacent DSC 50B via the conductive material 60P, and the conductive material connecting portion 16A of the connecting terminal 16 on the transparent conductive film 12E is connected with the metal substrate 21 of the counter electrode 20 of the adjacent DSC 50A via the conductive material 60P.

In addition, external connecting terminals 18a and 18b are provided on the first current extracting portion 12f and the second current extracting portion 12h, respectively.

As illustrated in FIG. 1, the sealing portion 30A has an annular first sealing portion 31A provided between the conductive substrate 15 and the counter electrode 20 and a second sealing portion 32A which is provided so as to be superimposed on the first sealing portion 31A and sandwiches an edge portion 20a of the counter electrode 20 together with the first sealing portion 31A. In addition, as illustrated in FIG. 4, the adjacent first sealing portions 31A are integrated so as to constitute a first integrated sealing portion 31. That is to say, the first integrated sealing portion 31 is constituted by an annular-shaped part 31a (hereinafter, referred to as the "annular portion") which is not provided between the two adjacent counter electrodes 20 and a part 31b (hereinafter, referred to as the "partitioning portion") which is provided between the two adjacent counter electrodes 20 and partitions an inner side opening 31c of the annular-shaped part 31a. In addition, as illustrated in FIG. 5, adjacent second sealing portions 32A are integrated between the adjacent counter electrodes 20 so as to constitute a second integrated sealing portion 32. The second integrated sealing portion 32 is constituted by an annular-shaped part 32a (hereinafter, referred to as the "annular portion") which is not provided between the two adjacent counter electrodes 20 and a part 32b (hereinafter, referred to as the "partitioning portion") which is provided between the two adjacent counter electrodes 20 and partitions an inner side opening 32c of the annular-shaped part 32a.

In addition, as illustrated in FIG. 1, between the first sealing portion 31A and the groove 90, an insulating material 33 composed of a glass frit is provided so as to enter into the groove 90 between the adjacent transparent conductive layers 12A to 12F and to spread over the adjacent transparent conductive layers 12. To describe in detail, the insulating material 33 also covers the edge portion of the main body portion 12 forming the first groove 90A as well as enters into the first groove 90A formed along the edge portion of the main body portion 12a of the transparent conductive layer 12 of the groove 90.

As illustrated in FIG. 6, the width P of the adhesive portion of the surface on the conductive substrate 15 side of the counter electrode 20 with the partitioning portion 31b of the first integrated sealing portion 31 is narrower than the width Q of the adhesive portion of the surface on the conductive substrate 15 side of the counter electrode 20 with the annular portion 31a of the first integrated sealing portion 31. Furthermore, the width R of the partitioning portion 31b of the first integrated sealing portion 31 is 100% or more and less than 200% of the width T of the annular portion 31a of the first integrated sealing portion 31.

In addition, the second integrated sealing portion 32 has a main body portion 32d provided on the side opposite to the working electrode 10 of the counter electrode 20 and an adhesive portion 32e provided between the adjacent counter electrodes 20. The second integrated sealing portion 32 is adhered to the first integrated sealing portion 31 by the adhesive portion 32e.

As illustrated in FIG. 1, the back sheet 80 is provided on the conductive substrate 15. The back sheet 80 includes a laminate 80A including a weather-resistant layer and a metal layer and an adhesive portion 80B which is provided on the side opposite to the metal layer with respect to the laminate 80A and adheres to the conductive substrate 15 via the coupling portion 14. Here, the adhesive portion 80B is provided in order to make the back sheet 80 adhere to the conductive substrate 15, and as illustrated in FIG. 1, the adhesive portion 80B may be formed on the peripheral portion of the laminate 80A. However, the adhesive portion 80B may be provided on the entire surface of the DSC 50 side of the laminate 80A. The peripheral portion 80a of the back sheet 80 is connected with the transparent conductive layers 12D, 12E, and 12F among the transparent conductive layers 12 by the adhesive portion 80B via the coupling portion 14. Here, the adhesive portion 80B is spaced apart from the sealing portion 30A of the DSC 50. Moreover, the coupling portion 14 is also spaced apart from the sealing portion 30A. Meanwhile, in the DSC module 100, the electrolyte 40 is not filled in the space which is on the inner side than the back sheet 80 and the outer side of the sealing portion 30A.

In addition, as illustrated in FIG. 2, in the transparent conductive layer 12D, a current collecting wiring 17 having a lower resistance than the transparent conductive layer 12D extends so as to pass through the main body portion 12a, the connecting portion 12g, and the current extracting portion 12f. This current collecting wiring 17 is disposed so as not to intersect with the coupling portion 14 of the back sheet 80 with the conductive substrate 15. That is to say, the current collecting wiring 17 is disposed on the inner side than the coupling portion 14.

Meanwhile, as illustrated in FIG. 2, bypass diodes 70A to 70D are connected in parallel with the DSCs 50A to 50D, respectively. Specifically, the bypass diode 70A is fixed on the partitioning portion 32b of the second integrated sealing portion 32 between the DSC 50A and the DSC 50B, the bypass diode 70B is fixed on the partitioning portion 32b of the second integrated sealing portion 32 between the DSC 50B and the DSC 50C, and the bypass diode 70C is fixed on the partitioning portion 32b of the second integrated sealing portion 32 between the DSC 50C and the DSC 50D. The bypass diode 70D is fixed on the sealing portion 30A of the DSC 50D. In addition, the conductive material 60Q is fixed to the metal substrate 21 of the counter electrode 20 so as to pass through the bypass diodes 70A to 70D. Moreover, the conductive material 60P branches out from the conductive materials 60Q between the bypass diodes 70A and 70B, between the bypass diodes 70B and 70C, and between the bypass diodes 70C and 70D, respectively, and is connected with the conductive material connecting portion 16A on the transparent conductive layer 12A, the conductive material connecting portion 16A on the transparent conductive layer 12B, and the conductive material connecting portion 16A on the transparent conductive layer 12C, respectively. In addition, the conductive material 60P is also fixed to the metal substrate 21 of the counter electrode 20 of the DSC 50A, and this conductive material 60P connects the bypass diode 70A with the conductive material connecting portion 16A of the connecting terminal 16 on the transparent conductive layer 12E. Moreover, the bypass diode 70D is connected with the transparent conductive layer 12D via the conductive material 60P.

In addition, as illustrated in FIG. 1, a desiccant 95 is provided on the counter electrode 20 of each DSC 50.

According to the above-described DSC module 100, the oxide semiconductor layer 13 has the light absorbing layer 13a and the reflecting layer 13b which is in contact with a portion of the first surface 91 of the light absorbing layer 13a, and the reflecting layer 13b is arranged in the inner side of the first surface 91 of the light absorbing layer 13a. The surface area $S_1$ of the first surface 91 and the surface area $S_2$ of the second surface satisfy the following formula.

$$0.7 \leq S_2/S_1 < 1$$

Namely, in the light reflecting layer 13a, the surface area $S_2$ of the second surface 92 which is in contact with the reflecting layer 13b is smaller than the surface area $S_1$ of the first surface 91 of the light absorbing layer 13a. In other words, an occupation ratio of the reflecting layer 13b which easily becomes a site of leakage current to the first surface 91 is reduced. For this reason, an open-circuit voltage can be increased. On the other hand, since $S_2/S_1$ is 0.7 or more, light incident from the light absorbing layer 13a can be sufficiently reflected, so that light absorbing efficiency of the light absorbing layer 13a may be improved. In this manner, according to the DSC module 100, $S_2/S_1$ satisfies the above-described formula, so that the open-circuit voltage can be increased and the light absorbing efficiency may be improved. In addition, the reflecting layer 13 is arranged in the inner side of the first surface 91 of the light absorbing layer 13a, so that the reflecting layer 13b does not cover a side surface of the light absorbing layer 13a. For this reason, since an electrolyte 40 is infiltrated from the side surface of the light absorbing layer 13a, a surface area where the electrolyte 40 and the light absorbing layer 13a are in contact with each other is increased and a distance until an oxidation-reduction pairs in the electrolyte 40 reach the light absorbing layer 13a is shortened, so that internal resistance is reduced. Therefore, according to the DSC module 100, photoelectric conversion characteristics can be sufficiently improved.

In addition, with respect to the DSC module 100, in the oxide semiconductor layer 13, the first surface 91 of the light absorbing layer 13a has the non-contact portion 93 which is not in contact with the reflecting layer 13b, and the non-contact portion 93 is arranged in the outer side of the second surface 92 but not arranged in the inner side thereof. For this reason, in comparison with a case where the non-contact portion 93 is arranged in the inner side of the second surface 92, the occurrence of voltage irregularities in the portion excluding the non-contact portion 93 in the first surface 91 can be more sufficiently suppressed. In addition, the light absorbing efficiency becomes constant in the inner portion of the light absorbing layer 13a, so that the leakage current can be suppressed. As a result, the photoelectric conversion characteristics can be more sufficiently improved. Herein, as illustrated in FIG. 8, in the oxide semiconductor layer 13, the second surface 92 is surrounded by the non-contact portion 93. For this reason, in the entire periphery of the second surface 92, the electrolyte 40 can be infiltrated from the first surface 91. Therefore, the oxidation-reduction pairs in the electrolyte 40 are more easily infiltrated into the light absorbing layer 13a, so that the internal resistance can be further reduced.

Furthermore, in the DSC module 100, the groove 90 is formed along the edge portion of the transparent conductive layer 12, and this groove 90 has the first groove 90A formed along the edge portion of the main body portion 12a of the transparent conductive layer 12 disposed on the inner side of the annular sealing portion 30A. Moreover, the insulating material 33 composed of a glass frit enters into the first groove 90A, and also this insulating material 33 covers the edge portion of the main body portion 12a forming the first groove 90A as well. For this reason, even if a crack is formed inside the transparent substrate 11 and at the position downward the groove 90 along the groove 90 and the crack continues to the edge portion of the main body portion 12a, the penetration of moisture, which has passed through the crack, from the outside of the sealing portion 30A is sufficiently suppressed by the insulating material 33. Particularly, in the DSC module 100, the insulating material 33 which covers the edge portion of the main body portion 12a forming the first groove 90A and enters into the first groove 90A is composed of a glass frit. For this reason, the DSC module 100 exhibits a higher sealing performance compared to a case in which the insulating material 33 is a resin. For this reason, according to the DSC module 100, it is possible to exhibit excellent durability.

In addition, in the DSC module 100, the sealing portion 30A and the insulating material 33 are disposed so as to be superimposed on each other. For this reason, it is possible to further increase the area of the part contributing to the power generation when seen from the light receiving surface side of the DSC module 100 compared to a case in which the sealing portion 30A and the insulating material 33 are disposed so as not to be superimposed on each other. For this reason, it is possible to more improve the aperture ratio.

In addition, in the DSC module 100, the first current extracting portion 12f and the second current extracting portion 12h are disposed in the vicinity of the DSC 50A and on the side opposite to the transparent conductive layer 12B with respect to the transparent conductive layer 12A, and the first current extracting portion 12f of the transparent conductive layer 12A and the second current extracting portion 12h of the transparent conductive layer 12E are disposed so as to be adjacent to each other via the groove 90. For this reason, in the DSC module 100, it is possible to dispose the external connecting terminals 18a and 18b to the first current extracting portion 12f and the second current extracting portion 12h, respectively, so as to be adjacent to each other. Hence, it is possible to set the number of connectors for extracting the current from the external connecting terminals 18a and 18b to the outside to one. In other words, the first current extracting portion 12f and the second current extracting portion 12h are disposed to be greatly spaced apart from each other, for example, in a case in which the first current extracting portion 12f is disposed on the side opposite to the transparent conductive layer 12c with respect to the transparent conductive layer 12D, and thus the external connecting terminals 18a and 18b are disposed to be greatly spaced apart from each other as well. In this case, two connectors of a connector to be connected with the external connecting terminal 18a and a connector to be connected with the external connecting terminal 18b are required in order to extract the current from the DSC module 100. However, according to the DSC module 100, it is possible to dispose the external connecting terminals 18a and 18b so as to be adjacent to each other, and thus only one connector is required. For this reason, according to the DSC module 100, it is possible to achieve space saving. In addition, the generated current is low in the DSC module 100 when the DSC module 100 is used under a low illuminance. Specifically, the generated current is 2 mA or lower. For this reason, it is possible to sufficiently suppress the deterioration of the photoelectric conversion performance of the DSC module 100 even if a part of the transparent conductive layer 12D of the DSC 50D on one end side of the DSC 50A and DSC 50D at both ends of the DSCs 50A to 50D is disposed next to the second current extracting portion 12h which is electrically connected with the metal substrate 21 of the counter electrode 20 of the DSC 50A on the other end side via the groove 90 as the first current extracting portion 12f.

In addition, in the DSC module 100, the DSCs 50A to 50D are arranged in a line along the X direction, the transparent conductive layer 12D of the DSC 50D on one end side of the DSC 50A and DSC 50D at both ends of the DSCs 50A to 50D has the main body portion 12a provided on the inner side of the sealing portion 30A, the first current extracting portion 12f, and the connecting portion 12g which connects the main body portion 12a with the first current extracting portion 12f. For this reason, it is possible to more shorten the installation region of the connecting terminal 16 provided along the arrangement direction (X direction in FIG. 2) of the DSCs 50A to 50D in order to connect two adjacent DSCs 50 compared to a case in which the DSCs 50C and 50D of a part of the DSCs 50A to 50D are folded back in the middle and the DSC 50A and the DSC 50D are disposed so as to be adjacent to each other, and thus it is possible to achieve space saving to a greater extent. Furthermore, according to the DSC module 100, the generated current is usually low in the DSC module 100 in a case in which the DSC module 100 is used in a low illuminance environment, and thus it is possible to sufficiently suppress the deterioration of the photoelectric conversion characteristics although the DSC module 100 further has the first connecting portion 12g which connects the main body portion 12a with the first current extracting portion 12f.

In addition, in the DSC module 100, a current collecting wiring 17 is arranged so as not to intersect the coupling portion 14 between the back sheet 80 and the conductive substrate 15. For this reason, the following advantages can be obtained. Namely, first, since the current collecting wiring 17 is generally porous, the current collecting wiring has gas permeability, and thus, gases such as water vapor are permeable. In this case, if the current collecting wiring 17 is arranged so as not to intersect the coupling portion 14 between the back sheet 80 and the conductive substrate 15, the infiltration of water vapor or the like from the outside through the current collecting wiring 17 into the space between the back sheet 80 and the conductive substrate 15 can be prevented. As a result, the DSC module 100 can have excellent durability. In addition, since the resistance of the current collecting wiring 17 is lower than that of the transparent conductive film 12D, even when a generating current becomes large, a deterioration in photoelectric conversion characteristics can be sufficiently suppressed.

Furthermore, the connecting terminal 16 is less likely to peel off from the protruding portion 12c of the transparent conductive layer 12 as the width of the connecting terminal 16 is narrower in a case in which the DSC module 100 is placed in an environment in which the temperature change is great. With regard to that point, in the DSC module 100, the conductive material non-connecting portion 16B of the connecting terminal 16 has a narrower width than the conductive material connecting portion 16A connected with the conductive material 60P. For this reason, the conductive material non-connecting portion 16B of the connecting terminals 16 is less likely to peel off from the protruding portion 12c of the transparent conductive layer 12. Hence, the conductive material non-connecting portion 16B does not peel off from the transparent conductive layer 12 and thus it is possible to maintain the connection with the transparent conductive layer 12 even if the conductive material connecting portion 16A peels off from the protruding portion 12c of the transparent conductive layer 12. Furthermore, it is possible to normally operate the DSC module 100 even if the conductive material connecting portion 16A peels off from the protruding portion 12c of the transparent conductive layer 12. Consequently, according to the DSC module 100, it is possible to improve the connection reliability. In addition, the conductive material 60P connected with the metal substrate 21 of the counter electrode 20 of one DSC 50 of two adjacent DSCs 50 is connected with the conductive material connecting portion 16A on the protruding portion 12c of the other DSC 50, and the conductive material connecting portion 16A is provided on the protruding portion 12c and the outer side of the sealing portion 30A. In other words, the connection of two adjacent DSCs 50 is performed on the outer side of the sealing portion 30A. For this reason, according to the DSC module 100, it is possible to improve the aperture ratio.

In addition, in the DSC module 100, in the DSC 50 that is connected with the adjacent DSC 50 among the DSCs 50A to 50D, the protruding portion 12c has the projecting portion 12d which laterally projects from the main body portion 12a and the facing portion 12e which extends from the projecting portion 12d and faces the main body portion 12a of the adjacent DSC 50, and at least the conductive material connecting portion 16A of the connecting terminal 16 is provided on the facing portion 12e.

In this case, at least the conductive material connecting portion 16A of the connecting terminal 16 is provided on the facing portion 12e facing the main body portion 12a of the adjacent DSC 50, and thus it is possible to sufficiently prevent the conductive material 60P connected with the conductive material connecting portion 16A from passing over the metal substrate 21 of the counter electrode 20 of the adjacent DSC 50 unlike the case in which at least the conductive material connecting portion 16A of the connecting terminal 16 is not provided on the facing portion 12e facing the main body portion 12a of the adjacent DSC 50. As a result, it is possible to sufficiently prevent the short circuit between the adjacent DSCs 50.

In addition, in the DSC module 100, both of the conductive material connecting portion 16A and the conductive material non-connecting portion 16B are disposed along the sealing portion 30A. For this reason, it is possible to save the space required for the connecting terminal 16 compared to the case of disposing the conductive material connecting portion 16A and the conductive material non-connecting portion 16B in the direction away from the sealing portion 30A.

Furthermore, in the DSC module 100, the adhesive portion 80B of the back sheet 80 is spaced apart from the sealing portion 30A of the DSC 50. For this reason, it is sufficiently suppressed that the sealing portion 30A is stretched since the adhesive portion 80B is constricted at a low temperature and thus an excessive stress is applied to the interface between the sealing portion 30A and the conductive substrate 15 or the counter electrode 20. In addition, at a high temperature as well, it is sufficiently suppressed that the sealing portion 30A is pressed since the adhesive portion 80B expands and thus an excessive stress is applied to the interface between the sealing portion 30A and the conductive substrate 15 or the counter electrode 20. In other words, it is sufficiently suppressed that an excessive stress is applied to the interface between the sealing portion 30A and the conductive substrate 15 or the counter electrode 20 both at a high temperature and a low temperature. For this reason, it is possible for the DSC module 100 to exhibit excellent durability.

Furthermore, in the DSC module 100, the width P of the adhesive portion of the surface on the conductive substrate 15 side of the counter electrode 20 with the partitioning portion 31b of the first integrated sealing portion 31 is narrower than the width Q of the adhesive portion of the surface on the conductive substrate 15 side of the counter electrode 20 with the annular portion 31a of the first integrated sealing portion 31. For this reason, it is possible to more sufficiently improve the aperture ratio of the DSC module 100. In addition, in the DSC module 100, the adjacent first sealing portions 31A are integrated between the adjacent counter electrodes 20 and the adjacent second sealing portions 32A are integrated between the adjacent counter electrodes 20. Here, the sealing portion exposed to the atmosphere is in two places in between the adjacent DSCs 50 when the adjacent first sealing portions 31A are not integrated. In contrast to this, in the DSC module 100, the sealing portion exposed to the atmosphere is in one place in between the adjacent DSCs 50 since the adjacent first sealing portions 31A are integrated. In other words, the sealing portion exposed to the atmosphere is in only one place of the partitioning portion 31b in between the adjacent DSCs 50 since the first integrated sealing portion 31 is constituted by the annular portion 31a and the partitioning portion 31b. In addition, the penetration distance of moisture or the like from the atmosphere to the electrolyte 40 extends since the first sealing portions 31A are integrated. For this reason, it is possible to sufficiently reduce the amount of moisture or air penetrating from the outside of the DSC 50 in between the adjacent DSCs 50. In other words, it is possible to sufficiently improve the sealing ability of the DSC module 100. In addition, according to the DSC module 100, the adjacent first sealing portions 31A are integrated. For this reason, it is possible to secure a sufficient sealing width at the partitioning portion 31b even if the width P of the adhesive portion of the surface on the conductive substrate 15 side of the counter electrode 20 with the partitioning portion 31b of the first integrated sealing portion 31 is narrower than the width Q of the adhesive portion of the surface on the conductive substrate 15 side of the counter electrode 20 with the annular portion 31a of the first integrated sealing portion 31. In other words, according to the DSC module 100, it is possible to sufficiently increase the bonding strength of the first sealing portion 31A with the conductive substrate 15 and the bonding strength of the first sealing portion 31A with the counter electrode 20 while improving the aperture ratio. As a result, it is possible to improve the aperture ratio as well as it is possible to sufficiently suppress the peeling of the first sealing portion 31A from the conductive substrate 15 and the counter electrode 20 even if the electrolyte 40 expands and thus an excessive stress directed from the inner side to the outer side of the first sealing portion 31A is applied in the case of using the DSC module 100 under a high temperature, and thus it is possible to exhibit excellent durability.

Furthermore, in the DSC module 100, the width R of the counter electrode 20 with the partitioning portion 31b of the first integrated sealing portion 31 is 100% or more and less than 200% of the width T of the annular portion 31a of the first integrated sealing portion 31. In this case, the width of the partitioning portion 31b is 100% or more of the width T of the annular portion 31a in the partitioning portion 31b of the first integrated sealing portion 31, and thus the penetration distance of moisture or the like from the atmosphere to the electrolyte 40 extends compared to a case in which the width R of the partitioning portion 31b is less than 100% of the width T of the annular portion 31a in the partitioning portion 31b of the first integrated sealing portion 31. For this reason, it is possible to more sufficiently suppress that the moisture penetrates from the outside through the partitioning portion 31b present between the adjacent DSCs 50. On the other hand, it is possible to more improve the aperture ratio compared to a case in which the width R of the partitioning portion 31b exceeds 200% of the width T of the annular portion 31a.

In addition, in the DSC module 100, the second sealing portion 32A is adhered to the first sealing portion 31A, and the edge portion 20a of the counter electrode 20 is sandwiched by the first sealing portion 31A and the second sealing portion 32A. For this reason, the peeling is sufficiently suppressed by the second sealing portion 32A even if the stress in the direction away from the working electrode 10 with respect to the counter electrode 20 is applied. In addition, the partitioning portion 32b of the second integrated sealing portion 32 is adhered to the first sealing portion 31A through the gap S between the adjacent counter electrodes 20 and thus it is reliably prevented that the counter electrodes 20 of the adjacent DSCs 50 come in contact with each other.

Next, the working electrode 10, the coupling portion 14, the photosensitizing dye, the counter electrode 20, the sealing portion 30A, the electrolyte 40, the conductive materials 60P and 60Q, the back sheet 80, and the desiccant 95 will be described in detail.

(Working Electrode)

The material constituting the transparent substrate 11 may be any transparent material, for example, and examples of such a transparent material may include glass such as borosilicate glass, soda lime glass, glass which is made of soda lime and whose iron component is less than that of ordinary soda lime glass, and quartz glass, polyethylene terephthalate (PET), polyethylene naphthalate (PEN), polycarbonate (PC), and polyethersulfone (PES). The thickness of the transparent substrate 11 is appropriately determined depending on the size of the DSC module 100 and is not particularly limited, but it may be set into the range of from 50 to 10000 μm, for example.

Examples of the material contained in the transparent conductive layer 12 may include a conductive metal oxide such as indium-tin-oxide (ITO), tin oxide ($SnO_2$), and fluorine-doped-tin-oxide (FTO). The transparent conductive layer 12 may be constituted by a single layer or a laminate consisting of a plurality of layers containing different conductive metal oxides. It is preferable that the transparent conductive layer 12 contain FTO since FTO exhibits high heat resistance and chemical resistance in a case in which the transparent conductive layer 12 is constituted by a single layer. The transparent conductive layer 12 may further contain a glass frit. The thickness of the transparent conductive layer 12 may be set into the range of from 0.01 to 2 μm, for example.

In addition, the resistance value of the connecting portion 12g of the transparent conductive layer 12D of the transparent conductive layer 12 is not particularly limited but is preferably equal to or less than the resistance value represented by the following Equation (1).

$$\text{Resistance value} = \text{number of DSC 50 connected in series} \times 120\Omega \tag{1}$$

In this case, it is possible to sufficiently suppress the deterioration of the performance of the DSC module 100 compared to a case in which the resistance value of the connecting portion 12g exceeds the resistance value represented by Equation (1) above. In the present embodiment, the number of DSCs 50 is 4 and thus the resistance value represented by Equation (1) above becomes 480Ω, and consequently, the resistance value of the connecting portion 12g is preferably 480Ω or less.

The thickness of the insulating material 33 is usually from 10 to 30 μm and preferably from 15 to 25 μm.

The connecting terminal 16 contains a metallic material. Examples of the metallic material may include silver, copper and indium. These may be used singly or in combination of two or more kinds thereof.

In addition, the connecting terminal 16 may be constituted by the same material as or a different material from the conductive material 60P but it is preferable to be constituted by the same material.

In this case, it is possible to more sufficiently improve the adhesive property of the connecting terminal 16 with the conductive material 60P since the connecting terminal 16 and the conductive material 60P are constituted by the same material. For this reason, it is possible to more improve the connection reliability of the DSC module 100.

In the connecting terminal 16, the width of the conductive material non-connecting portion 16B is not particularly limited as long as it is narrower than the width of the conductive material connecting portion 16A, but it is preferable to be equal to or less than ½ of the width of the conductive material connecting portion 16A.

In this case, it is possible to more improve the connection reliability of the DSC module 100 compared to a case in which the width of the conductive material non-connecting portion 16B exceeds ½ of the width of the conductive material connecting portion 16A.

The width of the conductive material connecting portion 16A is not particularly limited but is preferably from 0.5 to 5 mm and more preferably from 0.8 to 2 mm.

As described above, the oxide semiconductor layer 13 has the light absorbing layer 13a which is provided on the conductive substrate 15 and the reflecting layer 13b which is in contact with a portion of the first surface 91 of the light absorbing layer 13a. In addition, the first surface 91 of the light absorbing layer 13a has the second surface 92 which is in contact with the reflecting layer 13b, and the surface area $S_1$ of the first surface 91 and the surface area $S_2$ of the second surface 92 satisfy the following formula:

$$0.7 \leq S_2/S_1 < 1$$

Herein, preferably, the surface area $S_1$ of the first surface 91 and the surface area $S_2$ of the second surface 92 satisfy the following formula:

$$0.8 \leq S_2/S_1 \leq 0.95$$

In this case, the photoelectric conversion characteristics of the DSC module 100 are further improved. More preferably, the value of $S_2/S_1$ is in the range of 0.85 to 0.95.

The oxide semiconductor layer 13 typically contains a titanium oxide, and the titanium oxide includes an anatase crystalline titanium oxide made of an anatase type crystal and a rutile crystalline titanium oxide made of a rutile type crystal. In the oxide semiconductor layer 13, typically, the light absorbing layer 13a contains the anatase crystalline titanium oxide, and the reflecting layer 13b contains the rutile crystalline titanium oxide.

The shape of the titanium oxide contained in the oxide semiconductor layer 13 is not particularly limited and examples of the shape includes a spherical shape or a need-like shape.

Preferably, the rutile crystalline titanium oxide contained in the reflecting layer 13b has a spherical shape. Herein, the "spherical shape" denotes a shape of the titanium oxide where a ratio of maximum diameter to minimum diameter is 1 or more and 1.75 or less when the light absorbing layer 13a or the reflecting layer 13b is observed by a scanning electron microscope (SEM).

In this case, in comparison with a case where the rutile crystalline titanium oxide has a shape other than the spherical shape, the effect of scattering the light incident on the reflecting layer 13b is further improved, and the photoelectric conversion characteristics of the DSC module 100 is further improved.

In a case where the rutile crystalline titanium oxide contained in the reflecting layer 13b has a spherical shape, an average particle diameter of the rutile crystalline titanium oxide is typically in the range of 40 to 700 nm, and preferably in the range of 50 to 500 nm. If the average particle diameter of the rutile crystalline titanium oxide is in the range of 50 to 500 nm, in comparison with a case where the average particle diameter is deviated from this range, the light confinement effect of the reflecting layer 13b becomes more sufficient, and the photoelectric conversion characteristics of the DSC module 100 can be more sufficiently improved. The average particle diameter of the rutile crystalline titanium oxide contained in the reflecting layer 13b is more preferably in the range of 80 to 400 nm, and particularly preferably in the range of 100 to 300 nm. Herein, the average particle diameter denotes an average particle diameter measured by an X-ray diffraction apparatus (XRD, full automatic horizontal multi-purpose X-ray diffraction apparatus SmartLab produced by Rigaku Corporation) in a case where the average particle diameter of the titanium oxide is in the range of 1 to 100 nm and denotes an average particle diameter measured by a scanning electron microscope (SEM) in a case where the average particle diameter exceeds 100 nm. Herein, the average particle diameter measured by the SEM denotes an average value of the particle diameter calculated based on the following formula with respect to the titanium oxide observed by the SEM.

$$\text{Particle Diameter}=(S/\pi)^{1/2}$$

(In the above formula, S denotes the surface area of titanium oxide)

The content of the rutile crystalline titanium oxide in the reflecting layer 13b is not particularly limited, in a case where the reflecting layer 13b contains the rutile crystalline titanium oxide and the light absorbing layer 13a contains the anatase crystalline titanium oxide and the rutile crystalline titanium oxide, but the content of the rutile crystalline titanium oxide in the reflecting layer 13b is preferably larger than the content of the rutile crystalline titanium oxide in the light absorbing layer 13a.

In this case, for example, sunlight passes through the conductive substrate 15 and is incident on the oxide semiconductor layer 13. Then, the light passes through the light absorbing layer 13a of the oxide semiconductor layer 13 and is incident on the reflecting layer 13b. At this time, since a refractive index of the rutile crystalline titanium oxide is higher than that of the anatase crystalline titanium oxide, the rutile crystalline titanium oxide more easily scatters the light than the anatase crystalline titanium oxide. Furthermore, the content of the rutile crystalline titanium oxide in the reflecting layer 13b is larger than the content of the rutile crystalline titanium oxide in the light absorbing layer 13a. Namely, the reflecting layer 13b contains a larger amount of the rutile crystalline titanium oxide which easily scatters the light than the light absorbing layer 13a. For this reason, the light which passes through the light absorbing layer 13a and is incident on the reflecting layer 13b can be sufficiently returned to the light absorbing layer 13a. As a result, the light confinement effect in the oxide semiconductor layer 13 becomes sufficient. In addition, the photosensitizing dye is more easily adsorbed to the anatase crystalline titanium oxide than to the rutile crystalline titanium oxide. For this reason, the light absorbing layer 13a can more sufficiently absorb the light by using the photosensitizing dye adsorbed to the anatase crystalline titanium oxide than the reflecting layer 13b. In addition, since the light absorbing layer 13a contains the rutile crystalline titanium oxide, the light incident on the light absorbing layer 13a is more sufficiently scattered in the light absorbing layer 13a in comparison with a case where the light absorbing layer 13a does not contain the rutile crystalline titanium oxide. Since the scattered light is efficiently absorbed by the photosensitizing dye carried in the anatase crystalline titanium oxide, light absorption efficiency is increased. As described heretofore, according to the DSC module 100, the photoelectric conversion characteristics can be further improved.

Although a thickness of the reflecting layer 13b is not particularly limited, the thickness may be, for example, in the range of 1 to 10 μm.

The content of the rutile crystalline titanium oxide in the light absorbing layer 13a is preferably in the range of 3 to 15 mass %.

In this case, in comparison with a case where the content of the rutile crystalline titanium oxide in the light absorbing layer 13a is deviated from the aforementioned range, the light absorption and the light confinement are performed with a good balance, so that the photoelectric conversion characteristics of the DSC module 100 can be further improved.

The content of the rutile crystalline titanium oxide in the light absorbing layer 13a is more preferably in the range of 3 to 10 mass %.

Although a difference in content between the content of the rutile crystalline titanium oxide in the light absorbing layer 13a and the content of the rutile crystalline titanium oxide in the reflecting layer 13b may be more than 0 mass %, the difference in content is preferably 70 mass % or more and less than 100 mass %. In this case, in comparison with a case where the difference in content is deviated from the aforementioned range, the following advantages can be obtained. Namely, since the light confinement effect is further increased, the light absorbing efficiency can be improved. In addition, the content of the anatase crystalline titanium oxide in the light absorbing layer 13a is larger than the content of the anatase crystalline titanium oxide in the reflecting layer 13b. Namely, a specific surface area of the anatase crystalline titanium oxide which easily carries the photosensitizing dye can be further increased. For this reason, the photoelectric conversion characteristics of the DSC module 100 can be further improved.

The anatase crystalline titanium oxide contained in the light absorbing layer 13a may be configured with only an anatase crystalline titanium oxide for light absorption for allowing the light to be absorbed in the photosensitizing dye or may be configured with an anatase crystalline titanium oxide for light scattering for allowing the light to be scattered. However, the anatase crystalline titanium oxide is preferably configured with only the anatase crystalline titanium oxide for light absorption. In this case, the photoelectric conversion characteristics of the DSC module 100 can be particularly improved.

The light absorbing layer 13a may be configured with a single layer or may be configured with a stacked body of multiple layers.

A thickness of the light absorbing layer 13a is not particularly limited, but the thickness may be, for example, in the range of 2 to 30 μm.

Meanwhile, the oxide semiconductor layer 13 may be configured with oxide semiconductor particles other than the titanium oxide. As the oxide semiconductor particle, silicon oxide ($SiO_2$), zinc oxide (ZnO), tungsten oxide ($WO_3$), niobium oxide ($Nb_2O_5$), strontium titanate ($SrTiO_3$), tin oxide ($SnO_2$), indium oxide ($In_2O_3$), zirconium oxide ($ZrO_2$), thallium oxide ($Ta_2O_5$), lanthanum oxide ($La_2O_3$), yttrium oxide ($Y_2O_3$), holmium oxide ($Ho_2O_3$), bismuth oxide ($Bi_2O_3$), cerium oxide ($CeO_2$), and aluminum oxide ($Al_2O_3$) can be exemplified.

(Coupling Portion)

The material constituting the coupling portion 14 is not particularly limited as long as it can make the back sheet 80 adhere to the transparent conductive layer 12, and it is possible to use, for example, a glass frit, a resin material which is the same as the resin material used for the sealing portion 31A, or the like as the material constituting the coupling portion 14. Among them, the coupling portion 14 is preferably a glass frit. It is possible to effectively suppress the penetration of moisture or the like from the outside of the back sheet 80 since the glass frit exhibits higher sealing ability than the resin material.

(Photosensitizing Dye)

Examples of the photosensitizing dye may include a ruthenium complex having a ligand containing a bipyridine structure, terpyridine structure or the like, or an organic dye such as porphyrin, eosin, rhodamine, or merocyanine.

(Counter Electrode)

As described above, the counter electrode 20 is equipped with a metal substrate 21 and a conductive catalyst layer 22 which is provided on the working electrode 10 side of the metal substrate 21 and promotes the reduction reaction on the surface of the counter electrode 20.

The metal substrate 21 is constituted by, for example, a corrosion-resistant metallic material such as titanium, nickel, platinum, molybdenum, tungsten, aluminum, or stainless steel. The thickness of the metal substrate 21 is appropriately determined depending on the size of the DSC module 100 and is not particularly limited, but it may be set to from 0.005 to 0.1 mm, for example.

The catalyst layer 22 is constituted by platinum, a carbon-based material, or a conductive polymer. Here, a carbon nanotube is suitably used as the carbon-based material.

(Sealing Portion)

The sealing portion 30A is constituted by the first sealing portion 31A and the second sealing portion 32A.

Examples of the material constituting the first sealing portion 31A may include a resin such as a modified polyolefin resin including an ionomer, an ethylene-vinyl acetic anhydride copolymer, an ethylene-methacrylic acid copolymer, an ethylene-vinyl alcohol copolymer and the like, an ultraviolet-cured resin, and vinyl alcohol polymer.

The thickness of the first sealing portion 31A is usually from 40 to 90 μm and preferably from 60 to 80 μm.

The width P of the adhesive portion of the counter electrode 20 with the partitioning portion 31b is 25% or more and less than 100% of the width Q of the adhesive portion of the counter electrode 20 with the annular portion 31a of the first integrated sealing portion 31. In this case, it is possible to exhibit more excellent durability compared to a case in which the width P of the adhesive portion is less than 25% of the width Q of the adhesive portion. The width P of the adhesive portion is more preferably 30% or more and even more preferably 40% or more of the width Q of the adhesive portion.

In the DSC module 100, the width R of the partitioning portion 31b of the first integrated sealing portion 31 is preferably 100% or more and less than 200% and more preferably from 120 to 180% of the width T of the annular portion 31a of the first integrated sealing portion 31.

In this case, it is possible to balance a great aperture ratio with excellent durability.

Examples of the material constituting the second sealing portion 32A may include a resin such as a modified polyolefin resin including an ionomer, an ethylene-vinyl acetic anhydride copolymer, an ethylene-methacrylic acid copolymer, an ethylene-vinyl alcohol copolymer and the like, an ultraviolet-cured resin, and vinyl alcohol polymer in the same manner as the first sealing portion 31A. The material constituting the second sealing portion 32A is preferably the same as the first sealing portion 31A. In this case, it is possible to effectively suppress the penetration of moisture from outside and the leak of the electrolyte 40 since a boundary between the second sealing portion 32A and the first sealing portion 31A disappears.

The thickness of the second sealing portion 32A is usually from 20 to 45 μm and preferably from 30 to 40 μm.

(Electrolyte)

The electrolyte 40 contains, for example, a redox couple such as $I^-/I_3^-$ and an organic solvent. It is possible to use acetonitrile, methoxy acetonitrile, methoxy propionitrile, propionitrile, ethylene carbonate, propylene carbonate, diethyl carbonate, γ-butyrolactone, valeronitrile, pivalonitrile, glutaronitrile, methacrylonitrile, isobutyronitrile, phenyl acetonitrile, acrylonitrile, succinonitrile, oxalonitrile, pentanenitrile, and adiponitrile as the organic solvent. Examples of the redox couple may include a redox couple such as bromine/bromide ion, a zinc complex, an iron complex, and a cobalt complex in addition to $I^-/I_3^-$.

In addition, the electrolyte 40 may use an ionic liquid instead of the organic solvent. As the ionic liquid, it is possible to use, for example, an ordinary temperature molten salt which is a known iodine salt, such as a pyridinium salt, an imidazolium salt, and a triazolium salt, and which is in a molten state at around room temperature. As such an ordinary temperature molten salt, it is possible to suitably use, for example, 1-hexyl-3-methylimidazolium iodide, 1-ethyl-3-propylimidazolium iodide, dimethylimidazolium iodide, ethylmethylimidazolium iodide, dimethylpropylimidazolium iodide, butylmethylimidazolium iodide, or methylpropylimidazolium iodide.

In addition, the electrolyte 40 may use a mixture of the ionic liquid above and the organic solvent above instead of the organic solvent above.

In addition, it is possible to add an additive to the electrolyte 40. Examples of the additive may include LiI, $I_2$, 4-t-butylpyridine, guanidinium thiocyanate, 1-methylbenzimidazole, and 1-butylbenzimidazole.

Moreover, as the electrolyte 40, a nanocomposite gel electrolyte which is a quasi-solid electrolyte obtained by kneading nanoparticles such as $SiO_2$, $TiO_2$, and carbon nanotubes with the electrolyte above into a gel-like form may be used, or an electrolyte gelled using an organic gelling agent such as polyvinylidene fluoride, a polyethylene oxide derivative, and an amino acid derivative may also be used.

Meanwhile, the electrolyte 40 contains a redox couple consisting of $I^-/I_3^-$, and the concentration of $I_3^-$ is preferably 0.006 mol/L or less, more preferably from 0 to $6 \times 10^{-6}$ mol/L, and even more preferably from 0 to $6 \times 10^{-8}$ mol/L. In this case, it is possible to more reduce the leakage current since the concentration of $I_3^-$ which carries electrons is low. For this reason, it is possible to more increase the open circuit voltage, and thus it is possible to more improve the photoelectric conversion characteristics.

(Conductive Material)

As the conductive materials 60P and 60Q, for example, a metal film is used. It is possible to use, for example, silver or copper as the metallic material constituting the metal film.

(Back Sheet)

As described above, the back sheet 80 includes the laminate 80A including a weather resistant layer and a metal layer and the adhesive portion 80B which is provided on the surface of the DSC 50 side of the laminate 80A and adheres the laminate 80A to the coupling portion 14.

The weather resistant layer may be constituted by, for example, polyethylene terephthalate or polybutylene terephthalate.

The thickness of the weather resistant layer may be from 50 to 300 μm, for example.

The metal layer may be constituted by, for example, a metallic material containing aluminum. The metallic material is usually constituted by aluminum simple substance but may be an alloy of aluminum with other metals. Examples of the other metals may include copper, manganese, zinc, magnesium, lead, and bismuth. Specifically, a 1000 series aluminum is desirable in which other metals are added to aluminum of 98% or higher purity in a trace quantity. This is because this 1000 series aluminum is inexpensive and excellent in workability compared to other aluminum alloys.

The thickness of the metal layer is not particularly limited but may be from 12 to 30 μm, for example.

The laminate 80A may further include a resin layer. Examples of the material constituting the resin layer may include a butyl rubber, a nitrile rubber, and a thermoplastic resin. These can be used singly or in combination of two or more kinds thereof. The resin layer may be formed on the entire surface on the side opposite to the weather resistant layer of the metal layer or may be formed only on the peripheral portion thereof.

Examples of the material constituting the adhesive portion 80B may include a butyl rubber, a nitrile rubber, and a thermoplastic resin. These can be used singly or in combination of two or more kinds thereof. The thickness of the adhesive portion 80B is not particularly limited but may be from 300 to 1000 μm, for example.

(Desiccant)

The desiccant 95 may be in a sheet shape or granular. The desiccant 95 may be one which absorbs moisture, for example, and examples of the desiccant 95 may include silica gel, alumina, and zeolite.

Figure 9:
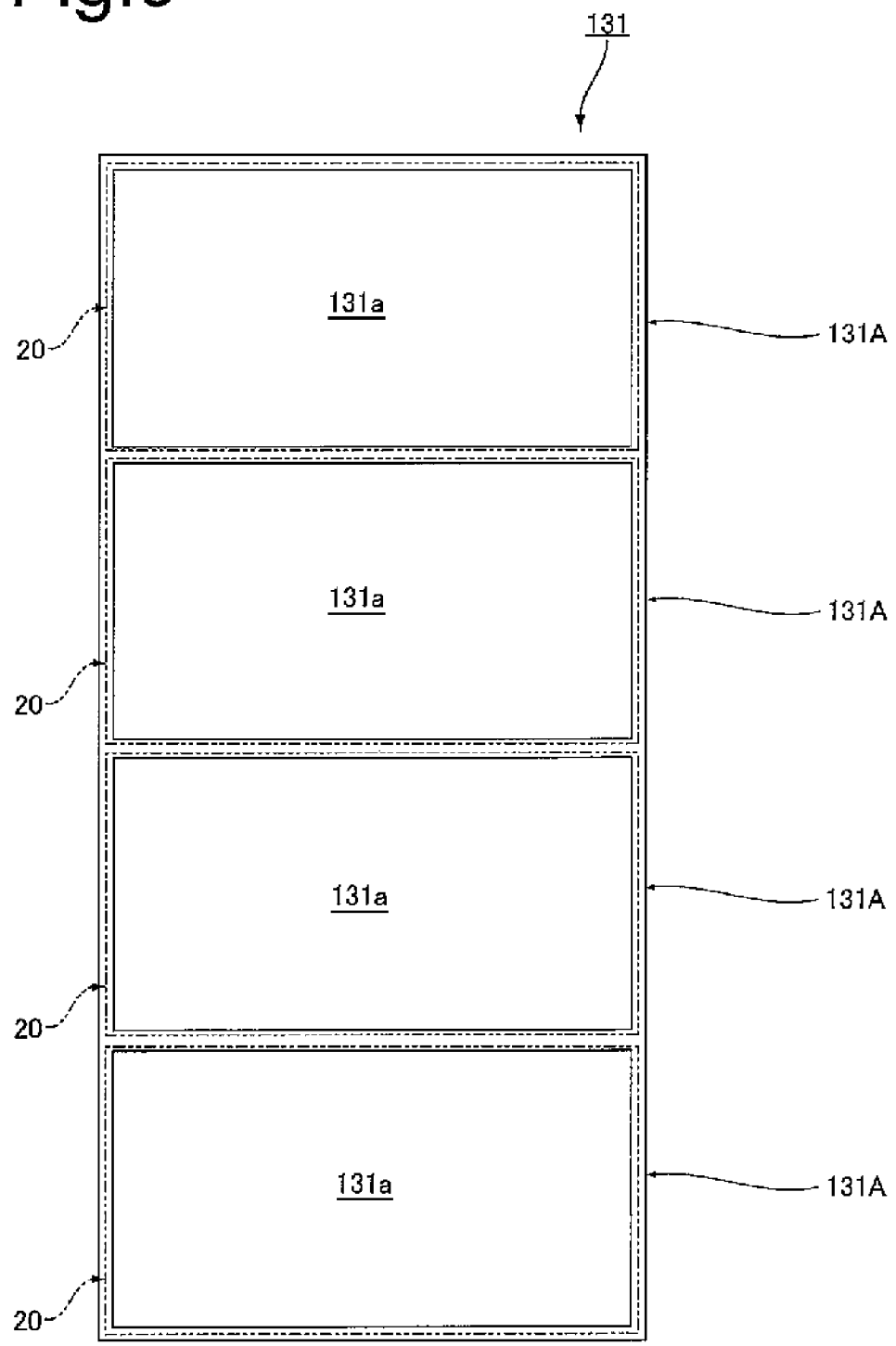
FIG. 9 is a plan view illustrating a first integrated sealing portion forming body for forming the first integrated sealing portion of FIG. 4.

Next, the method of manufacturing the DSC module 100 will be described with reference to FIG. 3, FIG. 7 and FIG. 9. FIG. 9 is a plan view illustrating a first integrated sealing portion forming body for forming a first integrated sealing portion of FIG. 4.

First, a laminate obtained by forming a transparent conductive layer on one transparent substrate 11 is prepared.

A As the method of forming the transparent conductive layer, a sputtering method, a vapor deposition method, a spray pyrolysis deposition method (SPD), or a CVD method is used.

Next, as illustrated in FIG. 3, the groove 90 is formed with respect to the transparent conductive layer, and the transparent conductive layers 12A to 12F which are disposed in an insulated state to interpose the groove 90 between one another are formed. Specifically, the four transparent conductive layers 12A to 12D corresponding to the DSCs 50A to 50D are formed so as to have the quadrangular-shaped main body portion 12a and the protruding portion 12c. At this time, the transparent conductive layers 12A to 12C corresponding to the DSCs 50A to 50C are formed such that the protruding portion 12c has not only the projecting portion 12d but also the facing portion 12e which extends from the projecting portion 12d and faces the main body portion 12a of the adjacent DSC 50. In addition, the transparent conductive layer 12D is formed so as to have not only the quadrangular-shaped main body portion 12a and the projecting portion 12d but also the first current extracting portion 12f and the connecting portion 12g connecting the first current extracting portion 12f and the main body portion 12a. At this time, the first current extracting portion 12f is formed so as to be disposed on the side opposite to the transparent conductive layer 12B with respect to the transparent conductive layer 12A. Moreover, the transparent conductive layer 12E is formed so as to form the second current extracting portion 12h. At this time, the second current extracting portion 12h is formed so as to be disposed on the side opposite to the transparent conductive layer 12B with respect to the transparent conductive layer 12A and to be disposed next to the first current extracting portion 12f via the groove 90.

It is possible to form the groove 90 by, for example, a laser scribing method using a YAG laser, a $CO_2$ laser or the like as the light source.

In this manner, a transparent conductive film 12 is formed on the transparent substrate 11.

Next, a precursor of the connecting terminal 16 constituted by the conductive material connecting portion 16A and the conductive material non-connecting portion 16B is formed on the protruding portion 12c of the transparent conductive layers 12A to 12C. Specifically, the precursor of the connecting terminal 16 is formed such that the conductive material connecting portion 16A is provided on the facing portion 12e. In addition, the precursor of the connecting terminal 16 is also formed on the transparent conductive layer 12E. In addition, the precursor of conductive material non-connecting portion 16B is formed so as to be narrower than the width of the conductive material connecting portion 16A. The precursor of the connecting terminal 16 can be formed, for example, by coating and drying a silver paste.

Moreover, a precursor of the current collecting wiring 17 is formed on the connecting portion 12g of the transparent conductive layer 12D. The precursor of the current collecting wiring 17 can be formed, for example, by coating and drying a silver paste.

In addition, precursors of the external connecting terminals 18a and 18b for extracting the current to the outside are respectively formed on the first current extracting portion 12f and the second current extracting portion 12h of the transparent conductive layer 12A. The precursor of the external connecting terminal can be formed, for example, by coating and drying a silver paste.

Furthermore, a precursor of the insulating material 33 composed of a glass frit is formed so as to enter into the first groove 90A formed along the edge portion of the main body portion 12a and to cover the edge portion of the main body portion 12a as well. The insulating material 33 can be formed, for example, by coating and drying a paste containing a glass frit.

In addition, in order to fix the back sheet 80, in the same manner as the insulating material 33, a precursor of the annular coupling portion 14 is formed so as to surround the insulating material 33 and to pass through the transparent conductive layer 12D, the transparent conductive layer 12E, and the transparent conductive layer 12F.

Furthermore, on each of the main body portions 12a of the transparent conductive films 12A to 12D, a precursor of the light absorbing layer 13a and a precursor of the reflecting layer 13b are sequentially formed, and a precursor of the oxide semiconductor layer 13 which is constituted by a stacked body of the precursor of the light absorbing layer 13a and the precursor of the reflecting layer 13b is formed.

The precursor of the light absorbing layer 13a is obtained by printing a paste for light absorbing layer for forming the light absorbing layer 13a and then drying. The paste for light absorbing layer contains a titanium oxide, a resin such as polyethylene glycol, ethyl cellulose, or the like, and a solvent such as terpineol or the like. The titanium oxide includes the anatase crystalline titanium oxide. The titanium oxide may include the rutile crystalline titanium oxide if needed. The content of the rutile crystalline titanium oxide in the entire titanium oxide contained in the paste for light absorbing layer is set to be equal to the content of the rutile crystalline titanium oxide in the light absorbing layer 13a.

The precursor of the reflecting layer 13b can be obtained by printing a paste for reflecting layer for forming the reflecting layer 13b and then drying. The paste for reflecting layer contains, for example, a titanium oxide, a resin such as polyethylene glycol, ethyl cellulose, or the like, and a solvent such as terpineol or the like. The titanium oxide includes the rutile crystalline titanium oxide. The titanium oxide may include the anatase crystalline titanium oxide, if needed. The content of the anatase crystalline titanium oxide in the entire titanium oxide contained in the paste for reflecting layer is set to be equal to the content of the rutile crystalline titanium oxide in the reflecting layer 13b.

As a method of printing the paste for light absorbing layer and the paste for reflecting layer, for example, a screen printing method, a doctor blade method, a barcode method, or the like may be used.

Finally, the precursor of the connecting terminal 16, the precursor of the insulating material 33, the precursor of the coupling portion 14, and the precursor of the oxide semiconductor layer 13 are collectively fired to form the connecting terminal 16, the insulating material 33, the coupling portion 14, and the oxide semiconductor layer 13.

At this time, the firing temperature varies depending on the kind of the oxide semiconductor particles or the glass frit but is usually from 350 to 600° C., and the firing time also varies depending on the kind of the oxide semiconductor particles or the glass frit but is usually from 1 to 5 hours.

In this manner, as illustrated in FIG. 7, obtained is the working electrode 10 which has the conductive substrate 15 and on which the coupling portion 14 for fixing the back sheet 80 is formed.

Next, the photosensitizing dye is supported on the oxide semiconductor layer 13 of the working electrode 10. For this, the photosensitizing dye may be adsorbed on the oxide semiconductor layer 13 by immersing the working electrode 10 in a solution containing the photosensitizing dye, the extra photosensitizing dye is then washed out with the solvent component of the above solution, and drying is performed, thereby the photosensitizing dye may be adsorbed on the oxide semiconductor layer 13. However, it is also possible to support the photosensitizing dye on the oxide semiconductor layer 13 by coating a solution containing the photosensitizer dye on the oxide semiconductor layer 13 and then drying to adsorb the photosensitizing dye on the oxide semiconductor layer 13.

Next, the electrolyte 40 is disposed on the oxide semiconductor layer 13.

Next, as illustrated in FIG. 9, a first integrated sealing portion forming body 131 for forming the first integrated sealing portion 31 is prepared. The first integrated sealing portion forming body 131 can be obtained by preparing one sheet of resin film for sealing composed of the material constituting the first integrated sealing portion 31 and forming a quadrangular-shaped opening 131a in the resin film for sealing as many as the number of the DSCs 50. The first integrated sealing portion forming body 131 has a structure formed by integrating a plurality of first sealing portion forming bodies 131A.

Thereafter, this first integrated sealing portion forming body 131 is adhered on the conductive substrate 15. At this time, the first integrated sealing portion forming body 131 is adhered so as to be superimposed on the insulating material 33. The adhesion of the first integrated sealing portion forming body 131 to the conductive substrate 15 can be performed by heating the first integrated sealing portion forming body 131 to melt. In addition, the first integrated sealing portion forming body 131 is adhered to the conductive substrate 15 such that the main body portion 12a of the transparent conductive layer 12 is disposed on the inner side of the first integrated sealing portion forming body 131.

Meanwhile, the counter electrodes 20 are prepared to have the same number as the number of the DSCs 50.

The counter electrode 20 can be obtained by forming the conductive catalyst layer 22 which promotes the reduction reaction on the surface of the counter electrode 20 on the metal substrate 21.

Next, one more piece of the first integrated sealing portion forming body 131 described above is prepared. Thereafter, each of the plural counter electrodes 20 is bonded so as to close each of the openings 131a of the first integrated sealing portion forming body 131.

Next, the first integrated sealing portion forming body 131 adhered to the counter electrode 20 and the first integrated sealing portion forming body 131 adhered to the working electrode 10 are superimposed and melted by heating while applying a pressure to the first integrated sealing portion forming body 131. In this manner, the first integrated sealing portion 31 is formed between the working electrode 10 and the counter electrode 20. At this time, the first integrated sealing portion 31 is formed such that the width P of the adhesive portion of the surface on the conductive substrate 15 side of the counter electrode 20 with the partitioning portion 31b of the first integrated sealing portion 31 is narrower than the width Q of the adhesive portion of the surface on the conductive substrate 15 side of the counter electrode 20 with the annular portion 31a of the first integrated sealing portion 31. In addition, the first integrated sealing portion 31 is formed such that the width R of the partitioning portion 31b of the first integrated sealing portion 31 is 100% or more and less than 200% of the width T of the annular portion 31a of the first integrated sealing portion 31. The formation of the first integrated sealing portion 31 may be performed under the atmospheric pressure or reduced pressure, but it is preferable to be performed under reduced pressure.

Next, the second integrated sealing portion 32 is prepared (see FIG. 5). The second integrated sealing portion 32 has a structure formed by integrating a plurality of the first sealing portions 32A. The second integrated sealing portion 32 can be obtained by preparing one sheet of resin film for sealing and forming a quadrangular-shaped opening 32c in the resin film for sealing as many as the number of the DSCs 50. The second integrated sealing portion 32 is bonded to the counter electrode 20 so as to sandwich the edge portion 20a of the counter electrode 20 together with the first integrated sealing portion 31. The adhesion of the second integrated sealing portion 32 to the counter electrode 20 can be performed by heating the second integrated sealing portion 32 to melt.

Examples of the resin film for sealing may include a resin such as a modified polyolefin resin including an ionomer, an ethylene-vinyl acetic anhydride copolymer, an ethylene-methacrylic acid copolymer, an ethylene-vinyl alcohol copolymer and the like, an ultraviolet-cured resin, and vinyl alcohol polymer. It is preferable that the constituent material of the resin film for sealing to form the second integrated sealing portion 32 have a higher melting point than the constituent material of the resin film for sealing to form the first integrated sealing portion 31. In this case, the second sealing portion 32A is harder than the first sealing portion 31A, and thus it is possible to effectively prevent the contact between the counter electrodes 20 of the adjacent DSCs 50. In addition, the first sealing portion 31A is softer than the second sealing portion 32A, and thus it is possible to effectively alleviate the stress applied to the sealing portion 30A.

Next, the bypass diodes 70A, 70B, and 70C are fixed to each of the three partitioning portions 32b of the second sealing portions 32. In addition, the bypass diode 70D is fixed on the sealing portion 30A of the DSC 50D as well.

Thereafter, the conductive material 60Q is fixed to the metal substrate 21 of the counter electrode 20 of the DSCs 50B and 50C so as to pass through the bypass diodes 70A to 70D. Moreover, the conductive material 60P is formed such that each of the conductive materials 60Q between the bypass diodes 70A and 70B, between the bypass diodes 70B and 70C, and between the bypass diodes 70C and 70D is connected with the conductive material connecting portion 16A on the transparent conductive layer 12A, the conductive material connecting portion 16A on the transparent conductive layer 12B, and the conductive material connecting portion 16A on the transparent conductive layer 12C, respectively. In addition, the conductive material 60P is fixed to the metal substrate 21 of the counter electrode 20 of the DSC 50A so as to connect the conductive material connecting portion 16A on the transparent conductive layer 12E and the bypass diode 70A. Moreover, the transparent conductive layer 12D is connected with the bypass diode 70A by the conductive material 60P.

At this time, with regard to the conductive material 60P, a paste containing a metallic material constituting the conductive material 60P is prepared, and this paste is coated from the counter electrode 20 over the conductive material connecting portion 16A of the connecting terminal 16 of the adjacent DSC 50 and cured. With regard to the conductive material 60Q, a paste containing a metallic material constituting the conductive material 60Q is prepared, and this paste is coated on each of the counter electrodes 20 so as to link the adjacent bypass diodes and cured. At this time, as the paste above, it is preferable to use a low-temperature curing type paste which is capable of being cured at a temperature of 90° C. or less from the viewpoint of avoiding an adverse effect on the photosensitizing dye.

Finally, the back sheet 80 is prepared, and the peripheral portion 80a of the back sheet 80 is adhered to the coupling portion 14. At this time, the back sheet 80 is disposed such that the adhesive portion 80B of the back sheet 80 is spaced apart from the sealing portion 30A of the DSC 50.

The DSC module 100 is obtained in the manner described above.

Meanwhile, in the description above, a method to collectively fire the precursor of the connecting terminal 16, the precursor of the insulating material 33, the precursor of the coupling portion 14, and the precursor of the oxide semiconductor layer 13 is used in order to form the connecting terminal 16, the insulating material 33, the coupling portion 14, and the oxide semiconductor layer 13, but the connecting terminal 16, the insulating material 33, the coupling portion 14, and the oxide semiconductor layer 13 may be formed by separately firing each of the precursors.

The invention is not limited to the embodiment described above. For example, in the above embodiment, the DSCs 50A to 50D are arranged in a line along the X direction in FIG. 2, but the DSCs 50C and 50D which are a part of the DSCs 50A to 50D are folded back in the middle and the DSC 50A and the DSC 50D are disposed so as to be adjacent to each other as a DSC module 200 illustrated in FIG. 10. In this case, unlike the DSC module 100, it is not necessary to provide the connecting portion 12g between the main body portion 12a and the first current extracting portion 12f in the transparent conductive layer 12D. For this reason, it is also not necessary to provide the current collecting wiring 17.

Figure 11:
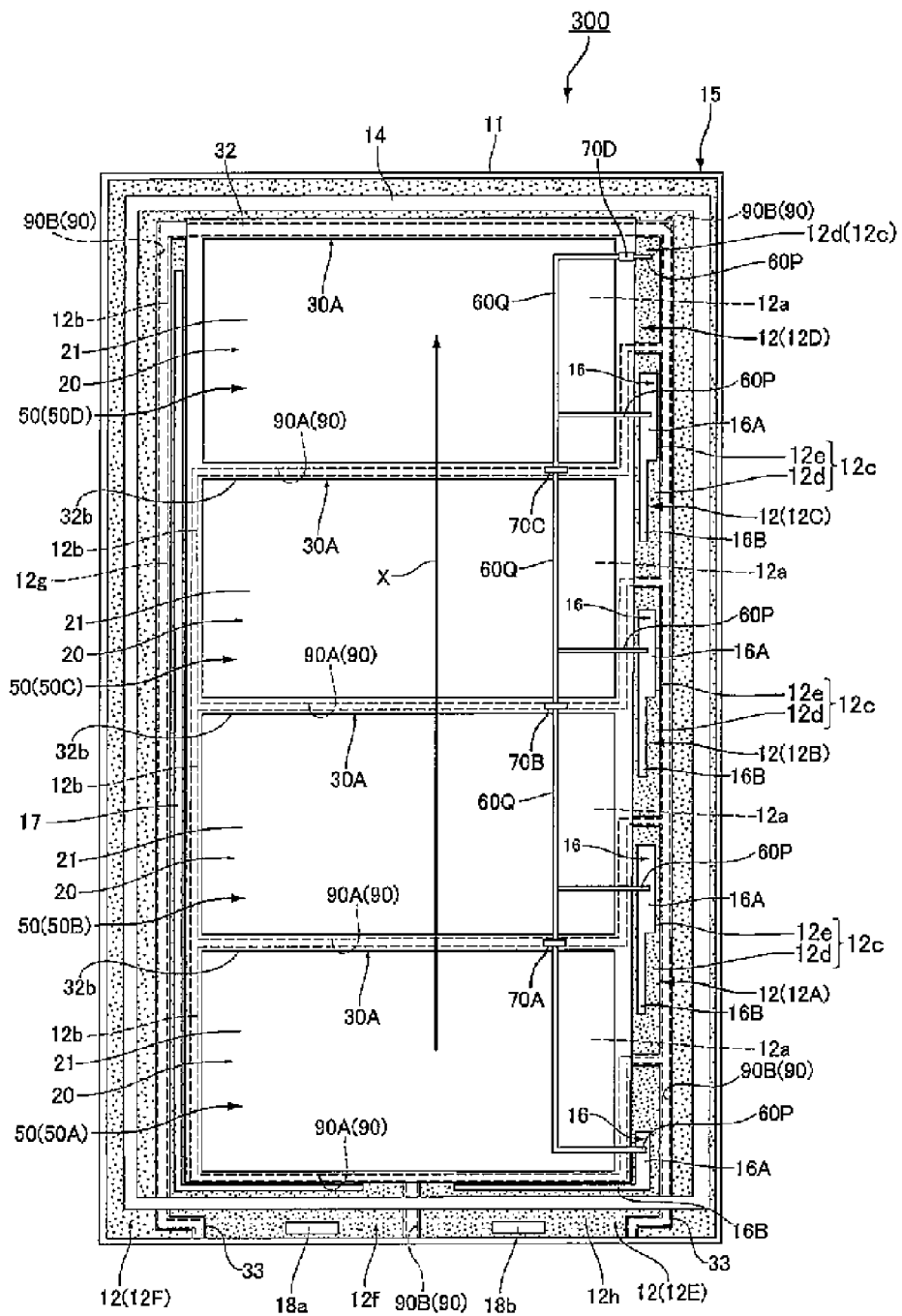
FIG. 11 is a plan view illustrating a portion of a third embodiment of the dye-sensitized solar cell element of the invention.

In addition, in the above embodiment, the second groove 90B which intersects the coupling portion 14 between the back sheet 80 and the conductive substrate 15 is not covered with the insulating material 33 made of a glass frit. However, like the DSC module 300 illustrated in FIG. 11, the second groove 90B is preferably covered with the insulating material 33 made of a glass frit. In addition, in FIG. 11, the back sheet 80 is omitted. As illustrated in FIG. 11, if the second groove 90B intersects the coupling portion 14, moisture can be infiltrated through the second groove 90B into the space between the back sheet 80 and the conductive substrate 15. In this case, the insulating material 33 enters into the second groove 90B, and the insulating material 33 covers an edge portion of the portion of the transparent conductive film 12 excluding the main body portion 12a, so that the infiltration of the moisture from the outer side of the back sheet 80 into the inner side is sufficiently suppressed. For this reason, the entrance of the moisture being infiltrated into the space between the back sheet 80 and the conductive substrate 15 into the inner side of the sealing portion 30A through the sealing portion 30A is sufficiently suppressed. For this reason, a deterioration in durability of the DSC module 300 can be sufficiently suppressed.

Figure 12:
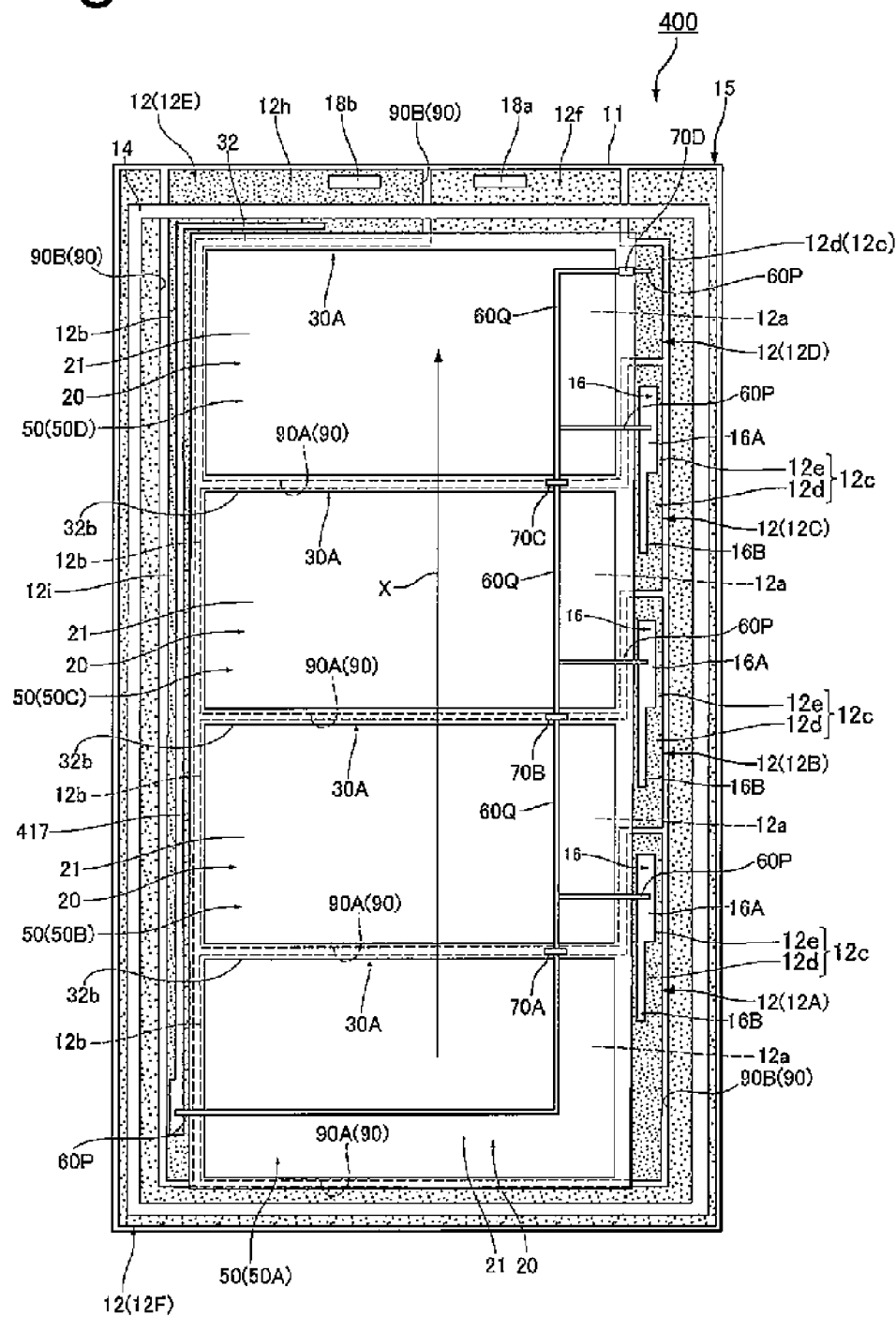
FIG. 12 is a plan view illustrating a portion of a fourth embodiment of the dye-sensitized solar cell element of the invention.

Furthermore, in the above embodiment, the first current extracting portion 12f and the second current extracting portion 12h are disposed in the vicinity on the DSC 50A side, but the first current extracting portion 12f and the second current extracting portion 12h may be disposed in the vicinity on the DSC 50D side as illustrated in a DSC module 400 illustrated in FIG. 12. In this case, the first current extracting portion 12f is provided so as to protrude on the side opposite to the DSC 50C with respect to the main body portion 12a of the transparent conductive layer 12D to the outer side of the sealing portion 30A. On the other hand, the second current extracting portion 12h is provided on the side opposite to the DSC 50C with respect to the main body portion 12a of the transparent conductive layer 12D. In addition, a connecting portion 12i as a second connecting portion extends along the transparent conductive layers 12A to 12D, and this connecting portion 12i connects the second current extracting portion 12h and the metal substrate 21 of the counter electrode 20 of the DSC 50A. Specifically, a current collecting wiring 417 is provided on the connecting portion 12i along the connecting portion 12i, and this current collecting wiring 417 is connected with the conductive material 60P extending from the bypass diode 70A. It is possible to achieve space saving while exhibiting excellent photoelectric conversion characteristics by this DSC module 400 as well. Meanwhile, in this case, it is the same as the above embodiment that it is preferable that the resistance value of the connecting portion 12i be equal to or less than the resistance value represented by the following Equation (1).

$$\text{Resistance value} = \text{number of DSC 50 connected in series} \times 120\Omega \quad (1)$$

In addition, in the above embodiment, the conductive substrate 15 has the insulating material 33. However, the conductive substrate may not have the insulating material 33. In this case, the sealing portion 30A and the first integrated sealing portion 31A are bonded to the transparent substrate 11, the transparent conductive film 12, or the connecting terminal 16. Herein, the conductive substrate 15 may not have the connecting terminal 16. In this case, the sealing portion 30A and the first integrated sealing portion 31A are bonded to the transparent substrate 11 or the transparent conductive film 12.

In addition, in the above embodiment, the groove 90 has the second groove 90B. However, the second groove 90B may not be necessarily formed.

In addition, in the above embodiment, the widths of the conductive material connecting portion 16A and the conductive material connecting portion 16B of the connecting terminal 16 are set to be constant, but each of the widths of the conductive material connecting portion 16A and the conductive material connecting portion 16B may change along the extending direction of the connecting terminal 16. For example, the width may monotonically increase from the end portion on the farthest side from the conductive material connecting portion 16A of the conductive material non-connecting portion 16B toward the end portion on the closest side thereof, and the width may monotonically increase from the end portion of the conductive material non-connecting portion 16B side of the conductive material connecting portion 16A toward the end portion on the farthest side from the conductive member non-connecting portion 16B.

In addition, in the above embodiment, the conductive material connecting portion 16A and the conductive material connecting portion 16B are provided along the sealing portion 30A, respectively, but these may be formed so as to extend in the direction away from the sealing portion 30A. However, in this case, it is preferable that the conductive material connecting portion 16A be disposed at the position closer to the sealing portion 30A than the conductive material non-connecting portion 16B. In this case, it is possible to more shorten the conductive material 60P.

Alternatively, in the connecting terminal 16 formed on the transparent conductive layers 12A to 12C, the conductive material non-connecting portion 16B may be disposed so that its extending direction is orthogonal to the extending direction of the conductive material connecting portion 16A In addition, the width of the conductive material connecting portion 16A is equal to or less than the width of the conductive material non-connecting portion 16B.

In addition, in the above embodiment, the second sealing portion 32A is adhered to the first sealing portion 31A, but the second sealing portion 32A may not be adhered to the first sealing portion 31A.

Furthermore, in the above embodiment, the sealing portion 30A is constituted by the first sealing portion 31A and the second sealing portion 32A, but the second sealing portion 32A may be omitted.

In addition, in the above embodiment, the width P of the adhesive portion of the counter electrode 20 with the partitioning portion 31b of the first integrated sealing portion 31 is narrower than the width Q of the adhesive portion of the counter electrode 20 with the annular portion 31a of the first integrated sealing portion 31, but the width P of the adhesive portion may be equal to or more than the width Q of the adhesive portion.

Furthermore, in the above embodiment, the width R of the partitioning portion 31b of the first integrated sealing portion 31 is 100% or more and less than 200% of the width T of the annular portion 31a of the first integrated sealing portion 31, but the width R of the partitioning portion 31b may be less than 100% or 200% or more of the width T of the annular portion 31a of the first integrated sealing portion 31.

In addition, in the above embodiment, the back sheet 80 is adhered to the transparent conductive layer 12 via the coupling portion 14 made of a glass frit, but the back sheet 80 is not required to be necessarily adhered to the transparent conductive layer 12 via the coupling portion 14.

Furthermore, in the above embodiment, the coupling portion 14 is spaced apart from the insulating material 33, but it is preferable that both of these be constituted by a glass frit and integrated. In this case, the interface between the coupling portion 14 and the conductive substrate 15 and the interface between the sealing portion 30A and the conductive substrate 15 are not present even if moisture penetrates into the space between the back sheet 80 and the conductive substrate 15. In addition, both of the insulating material 33 and the coupling portion 14 are composed of a glass frit and thus have a higher sealing ability compared to a resin. For this reason, it is possible to sufficiently suppress the penetration of moisture through the interface between the coupling portion 14 and the conductive substrate 15 and the interface between the insulating material 33 and the conductive substrate 15.

In addition, in the above embodiment, the insulating material 33 is composed of a glass frit, but the material constituting the insulating material 33 may be one having a higher melting point than the material constituting the first sealing portion 30A. For this reason, examples of such a material may include a thermosetting resin such as a polyimide resin and a thermoplastic resin in addition to a glass frit. Among them, it is preferable to use a thermosetting resin. In this case, even if the sealing portion 30A exhibits fluidity at a high temperature, the insulating material 33 is less likely to be fluidized even at a high temperature compared to the case of being composed of a thermoplastic resin in the same manner as the case of being composed of a glass frit. For this reason, the contact of the conductive substrate 15 with the counter electrode 20 can be sufficiently suppressed, and thus the short circuit between the conductive substrate 15 and the counter electrode 20 can be sufficiently suppressed.

Moreover, in the above embodiment, the plurality of DSCs 50 are connected in series but may be connected in parallel.

Figure 15:
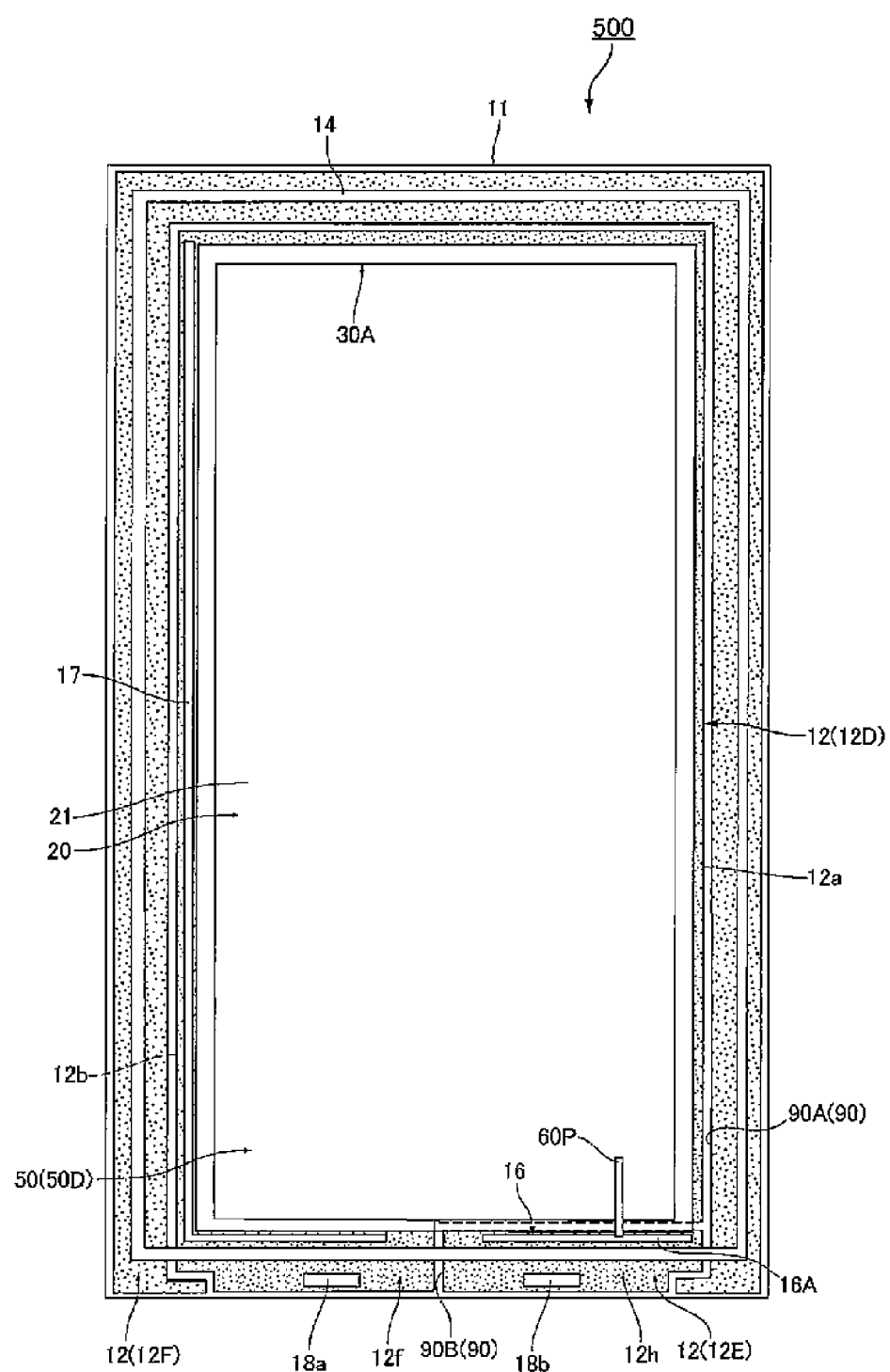
FIG. 15 is a plan view illustrating a portion of a fifth embodiment of the dye-sensitized solar cell element of the invention.

Furthermore, in the above embodiment, the plurality of DSCs 50 are used but only one DSC 50 may be used as a dye-sensitized solar cell element 500 illustrated in FIG. 12. Meanwhile, in the dye-sensitized solar cell element 500 illustrated in FIG. 15, the DSC 50A to DSC 50C are omitted, and the connecting terminal 16 provided on the second current extracting portion 12h is electrically connected with the metal substrate 21 of the counter electrode 20 of the DSC 50D via the conductive material 60P. In addition, in the dye-sensitized solar cell element 500, the connecting terminal 16 is constituted by only the conductive material connecting portion 16A, and this conductive material connecting portion 16A is disposed between the sealing portion 30A and the coupling portion 14. In other words, the conductive material connecting portion 16A is not disposed at the position facing the side edge portion 12b of the main body portion 12a of the transparent conductive layer 12D of the DSC 50D. For this reason, it is possible to increase the oxide semiconductor layer 13 in size to the space at the part at which the conductive material connecting portion 16A is disposed in the DSC module 100 of the first embodiment. In this case, it is possible to increase the area for power generation in size as well as to effectively utilize the wasted space.

Figure 10:
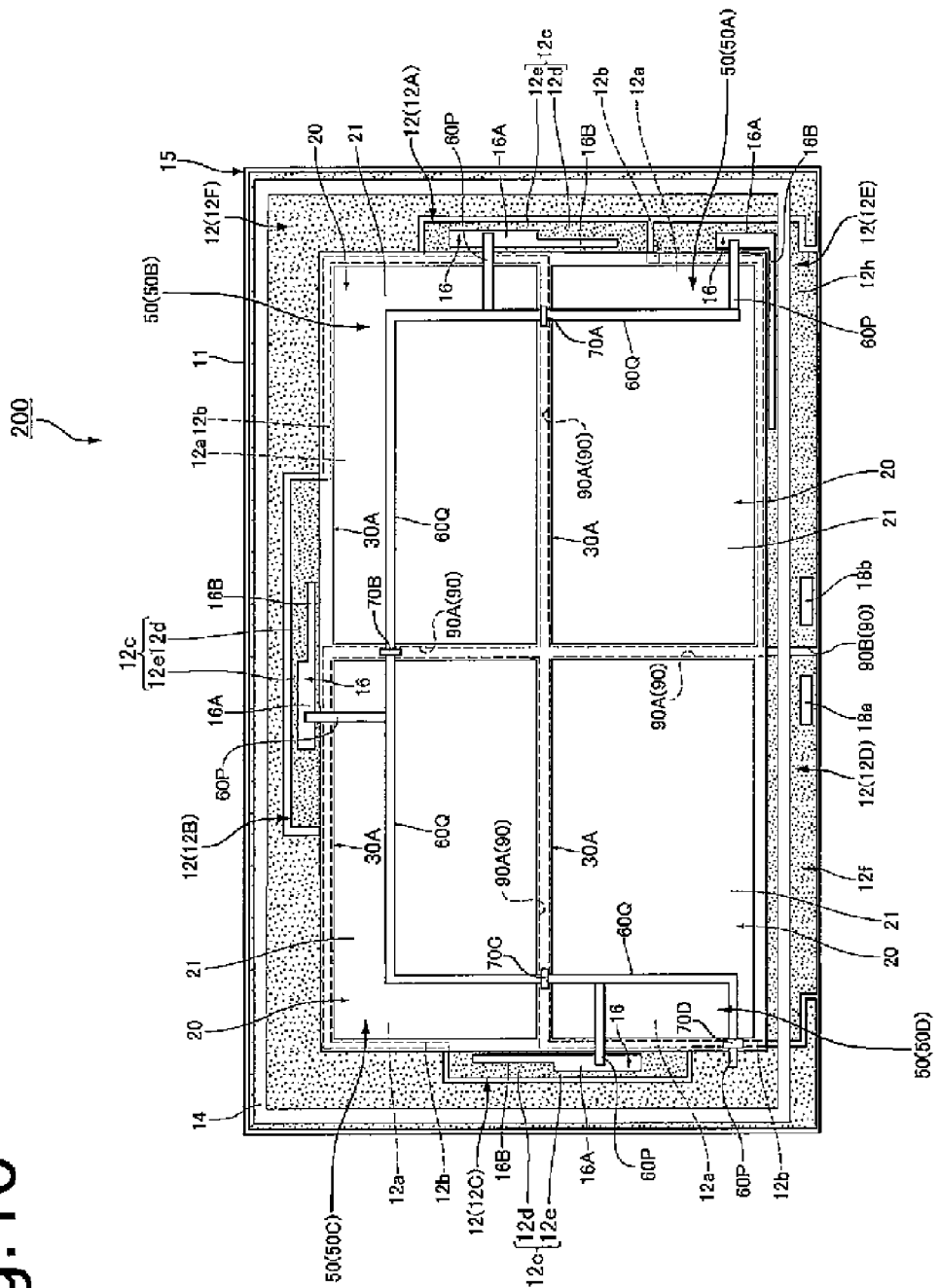
FIG. 10 is a plan view illustrating a portion of a second embodiment of the dye-sensitized solar cell element of the invention.

In addition, in the above embodiment, the number of DSCs 50 is four. However, the number of DSCs may be one or more, and it is not limited to four. In this manner, in a case where a plurality of the DSCs 50 are included, it is preferable that the DSCs 50 be arrayed in a fixed direction as illustrated in FIG. 2 rather than a case where some of the DSCs 50A to 50D are folded back in the middle thereof as illustrated in FIG. 10. In this manner, in a case where the DSCs 50 are arrayed in a fixed direction, it is possible to select both an even number and an odd number as the number of the DSC 50 and thus it is possible to freely determine the number of the DSC 50, and it is possible to improve the degree of freedom of the design as a result.

Figure 13:
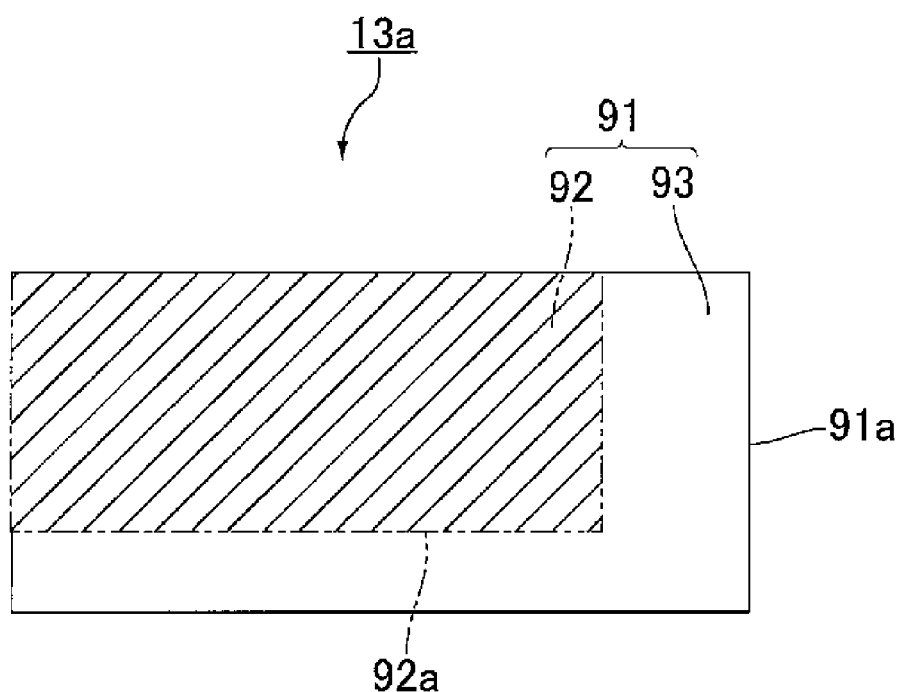
FIG. 13 is a plan view illustrating a first modified example of the second surface of the light absorbing layer of FIG. 8.
Figure 14:
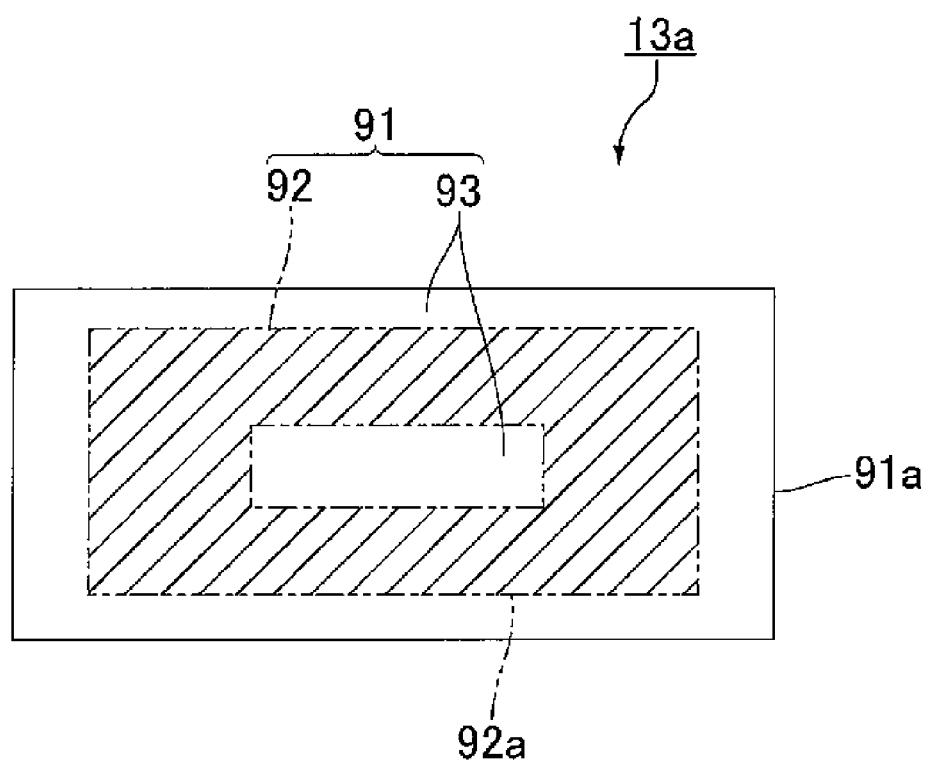
FIG. 14 is a plan view illustrating a second modified example of the second surface of the light absorbing layer of FIG. 8.

In addition, in the above embodiment, as illustrated in FIG. 8, the first surface 91 of the light absorbing layer 13a has the non-contact portion 93 which is not in contact with the reflecting layer 13b, the non-contact portion 93 is not arranged in the inner side of the second surface 92 and the second surface 92 is surrounded by the non-contact portion 93. However, as illustrated in FIG. 13, the second surface 92 may not be surrounded by the non-contact portion 93. Meanwhile, in FIG. 13, the second surface 92 is arranged in the inner side of the first surface 91. Namely, the second surface 92 is arranged in the inner side of the peripheral edge 91a of the first surface 91. In addition, as illustrated in FIG. 14, the non-contact portion 93 may be arranged in each of the outer side and the inner side of the second surface 92. In other words, the non-contact portion 93 may be arranged in each of the outer side and the inner side of the outer peripheral edge 92a of the second surface 92.

EXAMPLES

Hereinafter, the content of the invention will be described more specifically with reference to Examples, but the invention is not limited to the following Examples.

Example 1

First, a laminate obtained by forming a transparent conductive layer composed of FTO having a thickness of 1 μm on a transparent substrate which is composed of glass and has a thickness of 1 mm was prepared. Next, as illustrated in FIG. 3, the groove 90 was formed on the transparent conductive layer 12 by a $CO_2$ laser (V-460 manufactured by Universal Laser Systems Inc.), and the transparent conductive layers 12A to 12F were formed. At this time, the width of the groove 90 was set to 1 mm. In addition, each of the transparent conductive layers 12A to 12C was formed so as to have the main body portion having a quadrangular shape of 4.6 cm×2.0 cm and the protruding portion protruding from the side edge portion of one side of the main body portion. In addition, the transparent conductive layer 12D was formed so as to have the main body portion having a quadrangular shape of 4.6 cm×2.1 cm and the protruding portion protruding from the side edge portion of one side of the main body. In addition, the protruding portion 12c of the three transparent conductive layers 12A to 12C among the transparent conductive layers 12A to 12D was constituted by the projecting portion 12d projecting from the one side edge portion 12b of the main body portion 12a and the facing portion 12e which is extended from the projecting portion 12d and faced the main body portion 12a of the adjacent transparent conductive layer 12. In addition, the protruding portion 12c of the transparent conductive layer 12D was constituted only by the projecting portion 12d projecting from the one side edge portion 12b of the main body portion 12a. At this time, the length of the projecting direction (the direction orthogonal to the X direction in FIG. 2) of the projecting portion 12d was set to 2.1 mm and the width of the projecting portion 12d was set to 9.8 mm. In addition, the width of the facing portion 12e was set to 2.1 mm and the length of the facing portion 12e in the extending direction was set to 9.8 mm.

In addition, the transparent conductive layer 12D was formed so as to have not only the main body portion 12a and the protruding portion 12c but also the first current extracting portion 12f and the connecting portion 12g connecting the first current extracting portion 12f and the main body portion 12a. The transparent conductive layer 12E was formed so as to have the second current extracting portion 12h. At this time, the width of the connecting portion 12g was set to 1.3 mm and the length thereof was set to 59 mm. In addition, when the resistance value of the connecting portion 12g was measured by the four probe method, it was 100Ω.

Next, a precursor of the connecting terminal 16 constituted by the conductive material connecting portion 16A and the conductive material non-connecting portion 16B was formed on the protruding portion 12c of the transparent conductive layers 12A to 12C. Specifically, the precursor of the connecting terminal 16 was formed such that a precursor of the conductive material connecting portion 16A was provided on the facing portion 12e and a precursor of the conductive material non-connecting portion 16B was provided on the projecting portion 12d. At this time, the precursor of the conductive material non-connecting portion 16B was formed so as to be narrower than the width of the conductive material connecting portion 16A. The precursor of the connecting terminal 16 was formed by applying the silver paste ("GL-6000X16" manufactured by FUKUDA METAL FOIL & POWDER Co., LTD.) by screen printing and drying it.

Furthermore, a precursor of the current collecting wiring 17 was formed on the connecting portion 12g of the transparent conductive layer 12D. The precursor of the current collecting wiring 17 was formed by applying the silver paste by screen printing and drying it.

In addition, precursors of the external connecting terminals 18a and 18b for extracting the current to the outside were formed on the first current extracting portion 12f and the second current extracting portion 12h of the transparent conductive layer 12A, respectively. The precursors of the external connecting terminals were formed by applying the silver paste by screen printing and drying it.

Moreover, a precursor of the insulating material 33 composed of a glass frit was formed so as to enters into the first groove 90A and to cover the edge portion of the main body portion 12a forming the first groove 90A. The insulating material 33 was formed by applying a paste containing a glass frit by screen printing and drying it. At this time, the edge portion of the transparent conductive layer covered with the insulating material 33 was the part between the groove 90 and the position 0.2 mm away from the groove 90.

In addition, in order to fix the back sheet 80, in the same manner as the insulating material 33, a precursor of the annular coupling portion 14 composed of a glass frit was formed so as to surround the insulating material 33 and to pass through the transparent conductive layer 12D, the transparent conductive layer 12E, and the transparent conductive layer 12F. In addition, at this time, the precursor of the coupling portion 14 was formed such that the precursor of the current collecting wiring 17 was disposed on the inner side thereof. In addition, the coupling portion 14 was formed such that the first current extracting portion and the second current extracting portion were disposed on the outer side thereof. The coupling portion 14 was formed by applying a paste containing a glass frit by screen printing and drying it.

Furthermore, a precursor of the oxide semiconductor layer 13 was formed on the main body portion 12a of each of the transparent conductive films 12A to 12D. The precursor of the oxide semiconductor layer 13 was obtained by sequentially forming the precursor of the light absorbing layer and the precursor of the reflecting layer. At this time, the precursor of the light absorbing layer was obtained by applying a nanoparticle paste of a titanium oxide for forming the light absorbing layer containing an anatase crystalline titanium oxide (21NR produced by JGC Catalysts and Chemicals Ltd.) in a square shape by screen printing and drying it at 150° C. for 10 minutes.

In addition, the precursor of the reflecting layer was obtained by applying a nanoparticle paste of a titanium oxide for forming the reflecting layer containing an anatase crystalline titanium oxide (PST-400C produced by JGC Catalysts and Chemicals Ltd.) on a surface of a side opposite to the transparent conductive films 12A to 12D among the surfaces of the precursor of the light absorbing layer in a square shape by screen printing and drying it at 150° C. for 10 minutes. At this time, the nanoparticle paste of a titanium oxide for forming the reflecting layer was applied to the central portion of the surface in the side opposite to the transparent conductive films 12A to 12D among the surfaces of the precursor of the light absorbing layer and was not applied to the periphery thereof.

Next, the precursor of the connecting terminal 16, the precursor of the current collecting wiring 17, the precursors of the external connecting terminals 18a and 18b, the precursor of the insulating material 33, the precursor of the coupling portion 14, the precursor of the insulating material 33, and the precursor of the oxide semiconductor layer 13 were fired at 500° C. for 15 minutes to form the connecting terminal 16, the current collecting wiring 17, the external connecting terminals 18a and 18b, the coupling portion 14, the insulating material 33, and the oxide semiconductor layer 13. In this manner, the working electrode 10 which has the conductive substrate 15 and on which the coupling portion 14 is formed was obtained. At this time, the width of the conductive material connecting portion of the connecting terminal 16 was 1.0 mm and the width of the conductive material non-connecting portion thereof was 0.3 mm. In addition, the length along the extending direction of the conductive material connecting portion was 7.0 mm and the length along the extending direction of the conductive material non-connecting portion was 7.0 mm. In addition, the dimensions of the current collecting wiring 17, the external connecting terminals 18a and 18b, the coupling portion 14, and the oxide semiconductor layer 13 were as follows, respectively.

Current collecting wiring 17: 4 µm in thickness, 200 µm in width, 79 mm in length along the X direction in FIG. 2, and 21 mm in length along the direction orthogonal to the X direction in FIG. 2, External connecting terminals 18a and 18b: 20 µm in thickness, 2 µm in width, and 7 mm in length, Coupling portion 14: 50 µm in thickness, 3 mm in width, and Oxide semiconductor layer 13: 14 µm in thickness, 17 mm in length in the X direction in FIG. 2, and 42.1 mm in length in the direction orthogonal to the X direction in FIG. 2

In addition, the oxide semiconductor layer 13 was configured by the light absorbing layer and the reflecting layer which is in contact with a portion of the first surface as a surface in a side opposite to the transparent conductive films 12A to 12D among the surfaces of the light absorbing layer. Herein, the thickness of the light absorbing layer was 10 µm, and the surface area $S_1$ of the first surface was 716 mm$^2$. In addition, the thickness of the reflecting layer was 4 µm, and the surface area $S_2$ of the second surface being in contact with the reflecting layer in the first surface of the light absorbing layer was 687 mm$^2$. Therefore, the value of $S_2/S_1$ was 0.96 as listed in Table 1. At this time, the length of one side of the square of the first surface of the formed light absorbing layer and the length of the one side of the square of the second surface were measured by a three-dimensional measurement instrument (Smart Scope), and the $S_1$ and the $S_2$ were calculated from the measured values. In this manner, the working electrode was obtained.

Next, the working electrode obtained in the above-described manner was immersed for a whole day and night in a dye solution containing 0.2 mM of a photosensitizing dye consisting of N719 and a mixed solvent prepared by mixing acetonitrile and tert-butanol at a volume ratio of 1:1 as the solvent, and then taken out therefrom and dried, and thus the photosensitizing dye was supported on the oxide semiconductor layer.

Next, an electrolyte obtained by adding $I_2$, methyl benzimidazole, butyl benzimidazole, guanidium thiocyanate, and t-butylpyridine to a mixture of dimethyl propyl imidazolium iodide and 3-methoxy propionitrile was applied on the oxide semiconductor layer by a screen printing method and drying was performed, so that the electrolyte was arranged.

Next, the first integrated sealing portion forming body for forming the first sealing portion was prepared. The first integrated sealing portion forming body was obtained by preparing one sheet of resin film for sealing which had 8.0 cm×4.6 cm×50 µm and was composed of a maleic anhydride-modified polyethylene (product name: Bynel produced by DuPont) and forming four quadrangular-shaped openings in the resin film for sealing. At this time, the first integrated sealing portion forming body was fabricated such that each opening had a size of 1.7 cm×4.4 cm×50 µm, the width of the annular portion was 2 mm, and the width of the partitioning portion partitioning the inner side opening of the annular portion was 2.6 mm.

Thereafter, the first integrated sealing portion forming body was superimposed on the insulating material 33 of the working electrode and then the first integrated sealing portion forming body was adhered to the insulating material 33 of the working electrode by heating to melt.

Next, four sheets of the counter electrodes were prepared. Two counter electrodes of the four sheets of the counter electrodes were prepared by forming the catalyst layer which had a thickness of 5 nm and was composed of platinum on the titanium foil of 4.6 cm×1.9 cm×40 μm by the sputtering method. The rest two counter electrodes of the four sheets of the counter electrodes were prepared by forming the catalyst layer which had a thickness of 5 nm and was composed of platinum on the titanium foil of 4.6 cm×2.0 cm×40 μm by the sputtering method. In addition, another first integrated sealing portion forming body was prepared and this first integrated sealing portion forming body was adhered to the surface facing the working electrode of the counter electrode in the same manner as above.

Thereafter, the first integrated sealing portion forming body adhered to the working electrode was allowed to face the first integrated sealing portion forming body adhered to the counter electrode, and thus the first integrated sealing portion forming bodies were superimposed on each other. The first integrated sealing portion forming bodies were then melted by heating while applying a pressure to the first integrated sealing portion forming bodies in this state. The first sealing portion was formed between the working electrode and the counter electrode in this manner. At this time, the width P of the adhesive portion of the partitioning portion of the first integrated sealing portion with the surface on the conductive substrate side of the counter electrode, the width Q of the adhesive portion of the annular portion of the first integrated sealing portion with the surface on the conductive substrate side of the counter electrode, the width R of the partitioning portion of the first integrated sealing portion, and the width T of the annular portion thereof were as follows, respectively.

P=1.0 mm
Q=2.0 mm
R=2.6 mm
T=2.2 mm

Next, the second integrated sealing portion was prepared. The second integrated sealing portion was obtained by preparing one sheet of resin film for sealing which had 8.0 cm×4.6 cm×50 μm and was composed of maleic anhydride modified polyethylene (trade name: Bynel, manufactured by Du Pont) and forming four quadrangular-shaped openings in the resin film for sealing. At this time, the second integrated sealing portion was fabricated such that each opening had a size of 1.7 cm×4.4 cm×50 μm, the width of the annular portion was 2 mm, and the width of the partitioning portion partitioning the inner opening of the annular portion was 2.6 mm. The second integrated sealing portion was bonded to the counter electrode so as to sandwich the edge portion of the counter electrode together with the first integrated sealing portion. At this time, the second integrated sealing portion was bonded to the counter electrode and the first integrated sealing portion by heating the first integrated sealing portion and the second integrated sealing portion to melt while pressing the second integrated sealing portion to the counter electrode.

Next, the desiccant sheet was bonded on the metal substrate of each counter electrode with double-sided tape. The dimensions of the desiccant sheet were 1 mm in thickness×3 cm in length×1 cm in width, and Zeosheet (trade name, manufactured by Shinagawa Chemicals Co., Ltd.) was used as the desiccant sheet.

Next, as illustrated in FIG. 2, the bypass diodes 70A to 70C were respectively fixed to the three partitioning portions of the second integrated sealing portion by applying the low-temperature curing type silver paste (Dotite D500 manufactured by FUJIKURAKASEI CO., LTD.) so as to continue from the terminals at both ends of the bypass diode to the metal substrate 21 of the counter electrode 20. In addition, the bypass diode 70D was fixed on the annular portion of the second integrated sealing portion of the DSC 50D among the four DSCs 50A to 50D by applying the above low-temperature curing type silver paste so as to continue from one terminal of the terminals at both ends of the diode to the counter electrode. In this manner, the conductive material 60Q was formed so as to link the two adjacent bypass diodes with respect to the four bypass diodes 70A to 70D. At this time, the conductive material 60Q was formed by curing the above low-temperature curing type silver paste at 30° C. for 12 hours. RB751V-40 manufactured by ROHM was used as the bypass diode.

In addition, the conductive material 60P was formed by applying the low-temperature curing type silver paste (Dotite D-500 manufactured by FUJIKURAKASEI CO., LTD.) and curing it so as to connect each of the conductive materials 60Q between the bypass diodes and the conductive material connecting portion on the three transparent conductive layers 12A to 12C, respectively. Moreover, for the bypass diode 70A, the conductive material 60P was formed by applying the above low-temperature curing type silver paste and curing it so as to be connected with the conductive material connecting portion on the transparent conductive layer 12E. At this time, the conductive material 60P was formed by curing the above low-temperature curing type silver paste at 30° C. for 12 hours.

Next, the butyl rubber ("Aikameruto" manufactured by Aica Kogyo Co., Ltd.) was coated on the coupling portion 14 with a dispenser while being heated at 200° C. to form a precursor of the adhesive portion. On the other hand, a laminate, which is obtained by laminating a polybutylene terephthalate (PBT) resin film (50 μm in thickness), aluminum foil (25 μm in thickness), and a film (50 μm in thickness) composed of Bynel (trade name, manufactured by Du Pont) in this order, was prepared. Thereafter, the peripheral portion of this laminate 80A was superimposed on the precursor of the adhesive portion 80B, and a pressure was applied thereto for 10 seconds. In this manner, the back sheet 80 constituted by the adhesive portion 80B and the laminate 80A was obtained on the coupling portion 14. The DSC module was obtained in the manner described above.

Examples 2 to 5

A DSC module was produced in the same manner as Example 1 except that the value of $S_2/S_1$ was the value listed in Table 1.

Comparative Examples 1 to 10

DSC modules were produced in the same manner as Example 1 except that the values of $S_2/S_1$ were the values listed in Tables 2 and 3. Meanwhile, in Table 2, $S_2/S_1$ is 1 or more. However, this denotes that the reflecting layer covers the side peripheral surface of the light absorbing layer as well as the first surface of the light absorbing layer.

[Evaluation of Characteristics]

With respect to the DSC modules of Examples 1 to 5 and Comparative Examples 1 to 10 obtained in the above-described manners, the photoelectric conversion characteristics were evaluated.

(Photoelectric Conversion Characteristics)

With respect to the DSC modules of Examples 1 to 5 and Comparative Examples 1 to 10 obtained in the above-described manners, the photoelectric conversion efficiency η (%) was measured. Next, by using Comparative Example 5 as a reference, an increase rate (η increase rate) of the photoelectric conversion efficiency η was calculated based on the following formula. The results are listed in Tables 1 to 3.

η Increase Rate (%)=100×(Photoelectric Conversion Efficiency of Example or Comparative Example−Photoelectric Conversion Efficiency of Comparative Example 5)/Photoelectric Conversion Efficiency of Comparative Example 5

At this time, the measurement of the photoelectric conversion efficiency was performed by using a Xe lamp solar simulator (YSS-150 produced by Yamashita Denso Corporation) and an IV tester (MP-160 produced by EKO Instruments).

TABLE 1

|  | Example 1 | Example 2 | Example 3 | Example 4 | Example 5 |
|---|---|---|---|---|---|
| $S_2/S_1$ | 0.96 | 0.92 | 0.85 | 0.78 | 0.70 |
| η Increase Rate (%) | 2.14 | 2.77 | 2.77 | 1.39 | 1.39 |

TABLE 2

|  | Comparative Example 1 | Comparative Example 2 | Comparative Example 3 | Comparative Example 4 | Comparative Example 5 |
|---|---|---|---|---|---|
| $S_2/S_1$ | 1.44 | 1.34 | 1.17 | 1.08 | 1.00 |
| η Increase Rate (%) | −19.02 | −17.38 | −10.58 | −6.55 | 0 |

TABLE 3

|  | Comparative Example 6 | Comparative Example 7 | Comparative Example 8 | Comparative Example 9 | Comparative Example 10 |
|---|---|---|---|---|---|
| $S_2/S_1$ | 0.58 | 0.52 | 0.36 | 0.25 | 0.00 |
| η Increase Rate (%) | −1.39 | −3.40 | −5.29 | −18.77 | −26.20 |

As listed in Table 1, it was found that the photoelectric conversion efficiency of the DSC modules of Examples 1 to 5 is increased by 1% or more in comparison with the DSC module of Comparative Example 5. In addition, as listed in Tables 2 and 3, it was found that the photoelectric conversion efficiency of the DSC modules of Comparative Examples 1 to 4 and Comparative Examples 6 to 10 is decreased by 1% or more in comparison with the DSC module of Comparative Example 5.

It was found from the results described above that, according to the dye-sensitized solar cell element of the invention, the photoelectric conversion characteristics can be sufficiently improved.

EXPLANATIONS OF REFERRENCE NUMERALS

11 . . . transparent substrate
12 . . . transparent conductive film
13 . . . oxide semiconductor layer
13a light absorbing layer
13b . . . reflecting layer
15 . . . conductive substrate (first electrode)
16 . . . connecting terminal (first electrode)
20 . . . counter electrode (second electrode)
30A . . . sealing portion
33 . . . insulating material (first electrode)
40 . . . electrolyte
50, 50A to 50D . . . dye-sensitized solar cell
91 . . . first surface
92 . . . second surface
93 . . . non-contact portion
100, 200, 300, 400 . . . dye-sensitized solar cell module (dye-sensitized solar cell element)

The invention claimed is:

1. A dye-sensitized solar cell element comprising at least one dye-sensitized solar cell,
wherein the dye-sensitized solar cell includes:
a first electrode;
a second electrode which faces the first electrode; and
an oxide semiconductor layer which is provided on the first electrode,
wherein the oxide semiconductor layer includes:
a light absorbing layer which is provided on the first electrode; and
a reflecting layer as a layer which is in contact with a portion of a first surface of a side opposite to the first electrode among surfaces of the light absorbing layer and which is arranged at a position farthest from the first electrode,
wherein the first surface of the light absorbing layer includes a second surface which is in contact with the reflecting layer,
wherein a surface area $S_1$ of the first surface and a surface area $S_2$ of the second surface satisfy the following formula:

$0.7 \leq S_2/S_1 < 1$ wherein the reflecting layer is arranged in an inner side of the first surface of the light absorbing layer, wherein a non-contact portion of the first surface which is not in contact with the reflecting layer is not arranged in an inner side of the second surface, and
wherein the second surface is surrounded by the non-contact portion.

2. The dye-sensitized solar cell element according to claim 1, wherein the surface area $S_1$ of the first surface and the surface area $S_2$ of the second surface satisfy the following formula:

$0.8 \leq S_2/S_1 \leq 0.95$.

3. The dye-sensitized solar cell element according to claim 1,
wherein the oxide semiconductor layer contains an anatase crystalline titanium oxide made of an anatase crystal and a rutile crystalline titanium oxide made of a rutile crystal, wherein the reflecting layer contains the rutile crystalline titanium oxide, wherein the light absorbing layer contains the anatase crystalline titanium oxide and the rutile crystalline titanium oxide, and wherein a content of the rutile crystalline titanium oxide in the reflecting layer is larger than a content of the rutile crystalline titanium oxide in the light absorbing layer.

4. The dye-sensitized solar cell element according to claim 3, wherein a content of the rutile crystalline titanium oxide in the light absorbing layer is in the range of 3 to 15 mass %.

* * * * *